US010593682B2

(12) United States Patent
Masuoka et al.

(10) Patent No.: US 10,593,682 B2
(45) Date of Patent: Mar. 17, 2020

(54) METHOD FOR PRODUCING PILLAR-SHAPED SEMICONDUCTOR MEMORY DEVICE

(71) Applicant: Unisantis Electronics Singapore Pte. Ltd., Singapore (SG)

(72) Inventors: Fujio Masuoka, Tokyo (JP); Nozomu Harada, Tokyo (JP)

(73) Assignee: UNISANTIS ELECTRONICS SINGAPORE PTE. LTD., Singapore (SG)

(*) Notice: Subject to any disclaimer, the term of this patent is extended or adjusted under 35 U.S.C. 154(b) by 0 days.

(21) Appl. No.: 16/296,564

(22) Filed: Mar. 8, 2019

(65) Prior Publication Data

US 2019/0206880 A1    Jul. 4, 2019

Related U.S. Application Data

(60) Division of application No. 15/729,040, filed on Oct. 10, 2017, now Pat. No. 10,269,809, which is a
(Continued)

(51) Int. Cl.
*H01L 21/285*     (2006.01)
*H01L 27/11*      (2006.01)
(Continued)

(52) U.S. Cl.
CPC .... *H01L 27/1104* (2013.01); *H01L 21/28518* (2013.01); *H01L 21/28531* (2013.01);
(Continued)

(58) Field of Classification Search
CPC ......... H01L 21/76805; H01L 21/76831; H01L 21/76877; H01L 23/5226; H01L 27/11;
(Continued)

(56) References Cited

U.S. PATENT DOCUMENTS 9,379,025 B1 *   6/2016  Basker ............ H01L 21/823821
2003/0136978 A1  7/2003  Takaura et al.
(Continued)

FOREIGN PATENT DOCUMENTS

JP    H02-188966 A    7/1990
JP    H03-024753 A    2/1991
(Continued)

OTHER PUBLICATIONS

Morimoto, T. et al., "Self-Aligned Nickel-Mono-Silicide Technology for High-Speed Deep Submicrometer Logic CMOS ULSI" *IEEE Transaction on Electron Devices*, vol. 42, No. 5, 1995, pp. 915-922.
(Continued)

*Primary Examiner* — Shahed Ahmed
(74) *Attorney, Agent, or Firm* — Brinks Gilson & Lione

(57) ABSTRACT

A method for producing a semiconductor memory device includes forming two Si pillars on a substrate. In the Si pillars, inverter circuits are formed. The inverter circuits include drive N-channel SGTs each including first and second $N^+$ layers functioning as a source and a drain, and load SGTs each including first and second $P^+$ layers functioning as a source and drain. Selection SGTs each including third and fourth $N^+$ layers functioning as a source and a drain are formed above $SiO_2$ layers disposed above the inverter circuits. The first $N^+$ layer is connected to a ground wiring metal layer. The first $P^+$ layers are connected to a power supply wiring metal layer through a NiSi layer. Gate TiN layers are connected to a word-line wiring metal layer through a NiSi layer. The third $N^+$ layers are connected to an inverted bit-line wiring metal layer and a bit-line wiring metal layer.

6 Claims, 18 Drawing Sheets

Related U.S. Application Data continuation of application No. PCT/JP2015/069689, filed on Jul. 8, 2015.

(51) Int. Cl.

| | | |
|---|---|---|
| *H01L 29/423* | (2006.01) | |
| *H01L 29/786* | (2006.01) | |
| *H01L 21/768* | (2006.01) | |
| *H01L 23/522* | (2006.01) | |
| *H01L 23/528* | (2006.01) | |
| *H01L 29/78* | (2006.01) | |
| *H01L 29/45* | (2006.01) | |
| *H01L 29/49* | (2006.01) | |

(52) U.S. Cl.
CPC ...... *H01L 21/76805* (2013.01); *H01L 23/528* (2013.01); *H01L 23/5226* (2013.01); *H01L 29/42392* (2013.01); *H01L 29/7827* (2013.01); *H01L 29/78642* (2013.01); *H01L 21/76831* (2013.01); *H01L 29/4238* (2013.01); *H01L 29/456* (2013.01); *H01L 29/4966* (2013.01)

(58) Field of Classification Search
CPC ......... H01L 29/42356; H01L 29/66666; H01L 29/7827; H01L 27/11807; H01L 29/42392; H01L 21/823885; H01L 27/1104; H01L 21/2254; H01L 21/324; H01L 21/823814; H01L 23/528
See application file for complete search history.

(56) References Cited

U.S. PATENT DOCUMENTS

| | | |
|---|---|---|
| 2004/0262635 A1 | 12/2004 | Lee |
| 2010/0219483 A1 | 9/2010 | Masuoka et al. |
| 2011/0084314 A1* | 4/2011 | Or-Bach ............ H01L 29/78645 257/209 |
| 2014/0061808 A1 | 3/2014 | Nakatsuka et al. |
| 2015/0017767 A1* | 1/2015 | Masuoka ............... H01L 27/092 438/211 |

FOREIGN PATENT DOCUMENTS

| | | |
|---|---|---|
| JP | 2003-224211 A | 8/2003 |
| JP | 2007-525004 A | 8/2007 |
| JP | 2010-040538 A | 2/2010 |
| JP | 2012-209340 A | 10/2012 |
| JP | 2014-53424 A | 3/2014 |
| JP | 5692884 B | 4/2015 |
| WO | WO2014/184933 A1 | 11/2014 |

OTHER PUBLICATIONS

Shibata, T. et al., "A New Field Isolation Technology for High Density MOS LSI", *Japanese Journal of Applied Physics*, vol. 18, 1979, pp. 263-267.

Takato, H. et al., "Impact of Surrounding Gate Transistor (SGT) for Ultra-High-Density LSI's", *IEEE Transaction on Electron Devices*, vol. 38, No. 3, 1991, pp. 573-578.

Gandhi, R. et al. " Vertical Si-Nanowire n-Type Tunneling FETs With Low Subthreshold Swing(<50mV/decade) at Room Temperature", *IEEE Electron Device Letter*, vol. 32, No. 4, 2011 pp. 437-439.

International Preliminary Report on Patentability in corresponding International Application No. PCT/JP2015/078776, dated Oct. 12, 2017, 6 pages.

International Preliminary Report on Patentability in corresponding International Application No. PCT/JP2015/060763, dated Oct. 19, 2017, 5 pages.

English language translation of International Preliminary Examination Report in International Application No. PCT/JP2015/069689, dated Jan. 11, 2018, 6 pages.

* cited by examiner

FIG. 2KA
FIG. 2KB
FIG. 2KC
FIG. 2KD
FIG. 2LA
FIG. 2LB
FIG. 2LC
FIG. 2LD
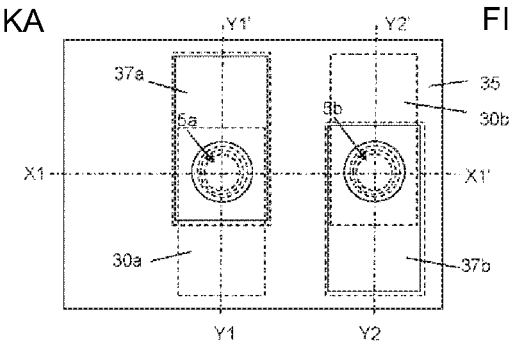
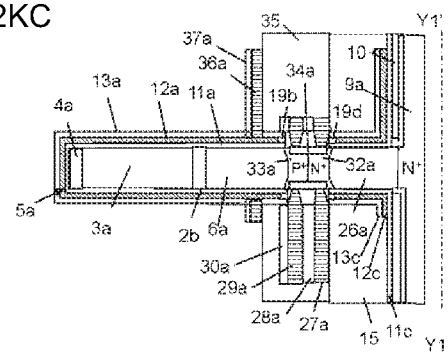
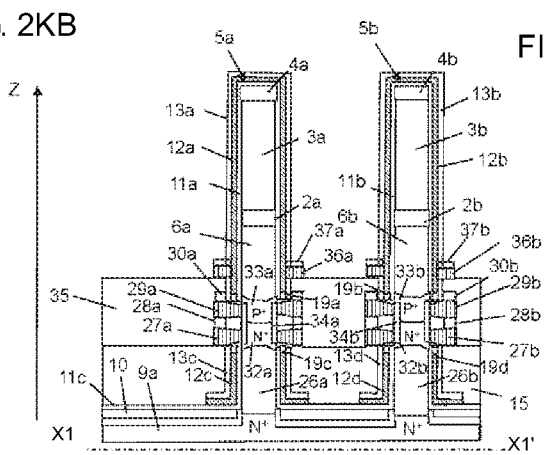
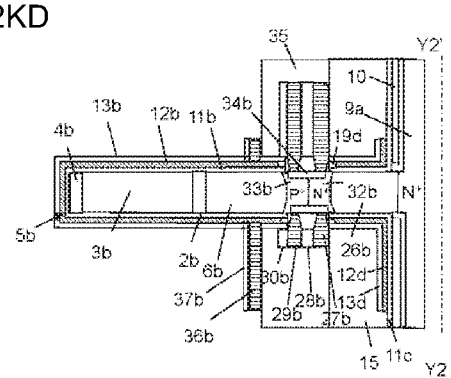
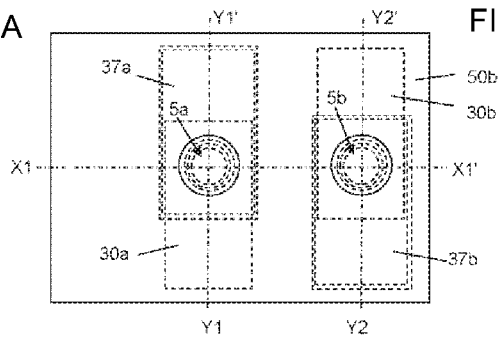
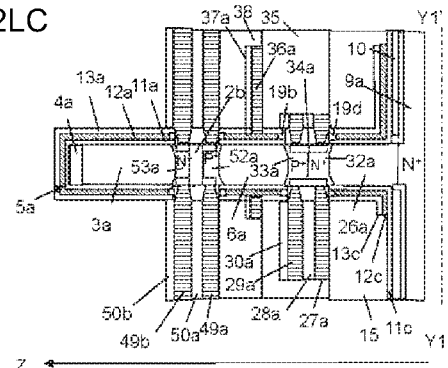
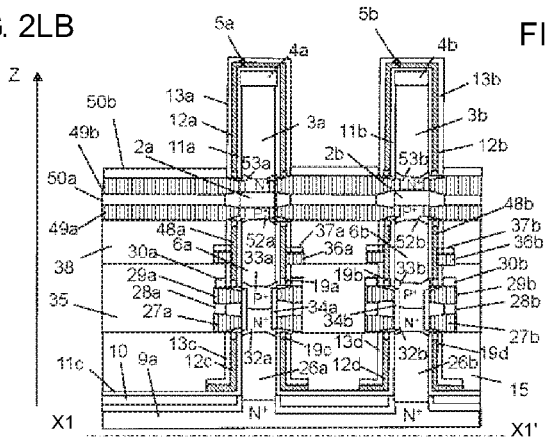
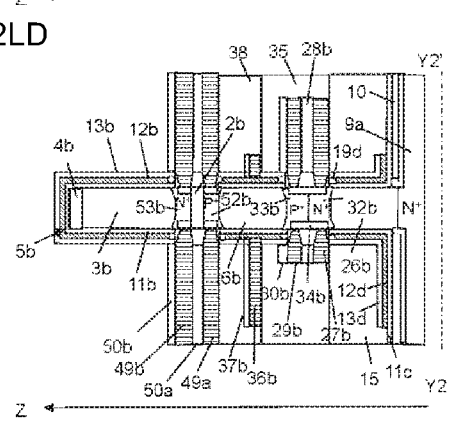

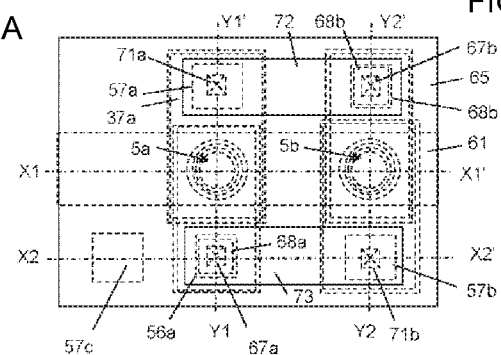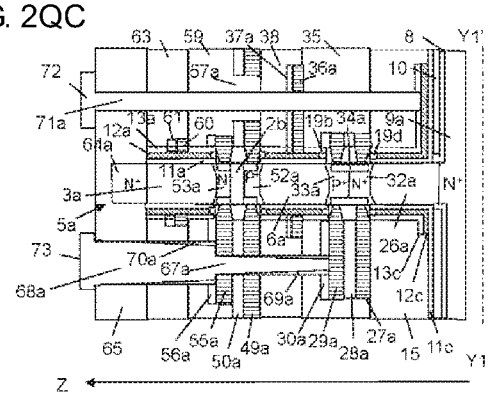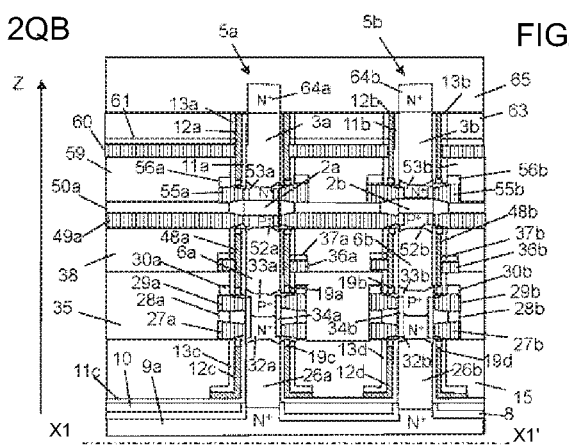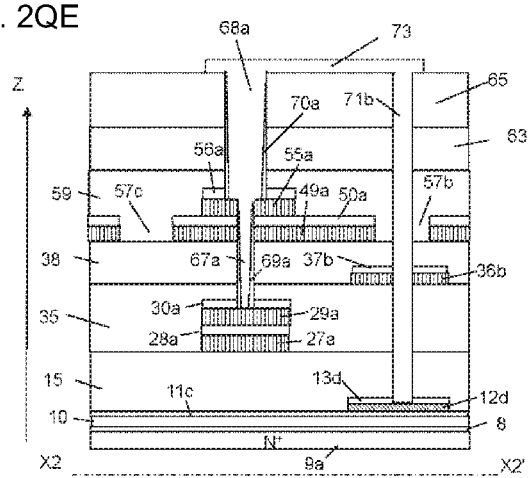

FIG. 5A
FIG. 5C
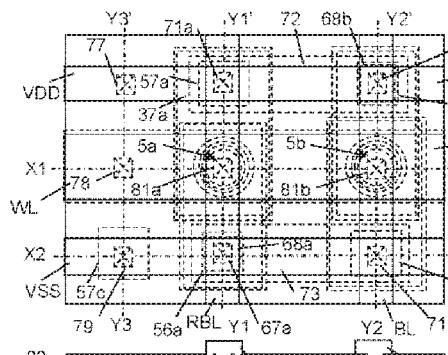
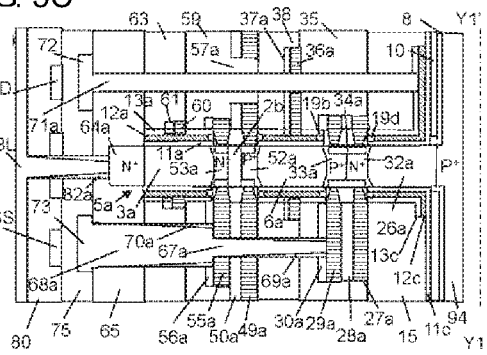
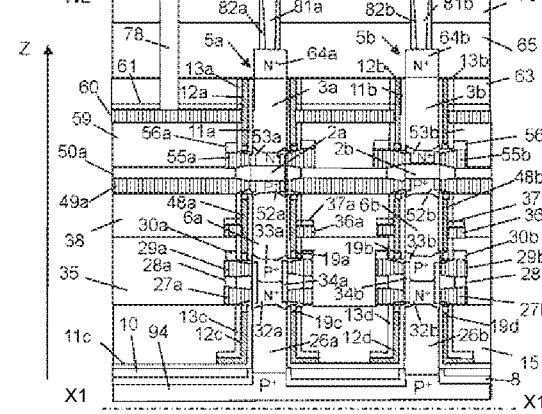
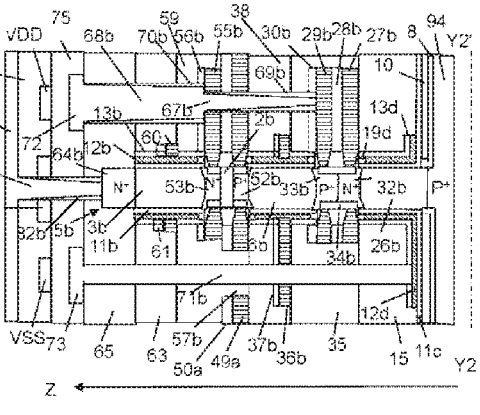
FIG. 5B
FIG. 5D
FIG. 5E
FIG. 5F
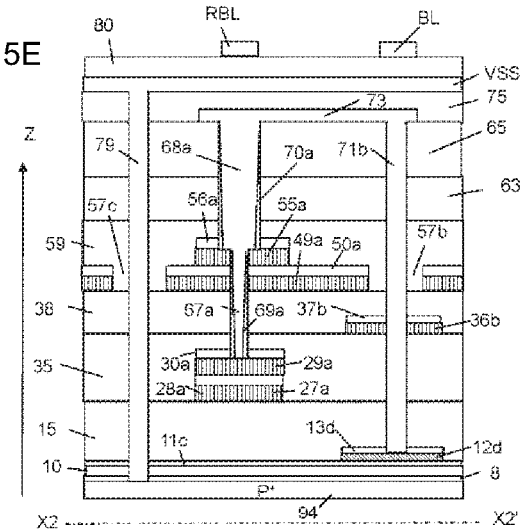
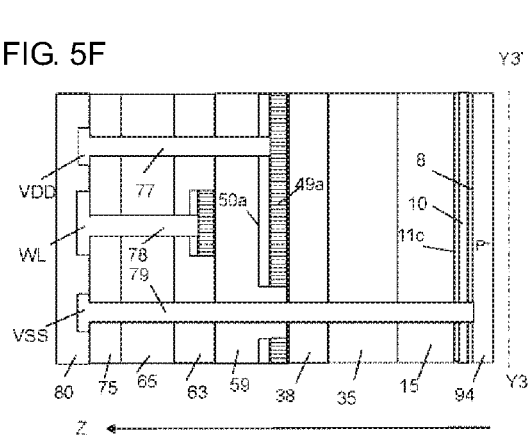

METHOD FOR PRODUCING PILLAR-SHAPED SEMICONDUCTOR MEMORY DEVICE

RELATED APPLICATIONS

The present application is divisional application of U.S. patent application Ser. No. 15/729,040, filed Oct. 10, 2017, which is a continuation application of PCT/JP2015/069689, filed Jul. 8, 2015, the entire contents of which are incorporated herein by reference.

BACKGROUND OF THE INVENTION

1. Field of the Invention

The present invention relates to a pillar-shaped semiconductor memory device and a method for producing the pillar-shaped semiconductor memory device.

2. Description of the Related Art

In recent years, surrounding gate MOS transistors (SGTs), which are typical pillar-shaped semiconductor devices, have been attracting attention as semiconductor elements that provide highly integrated semiconductor devices. There has been a demand for realization of a higher degree of integration and a higher performance of an SGT-including semiconductor memory device.

Ordinary planar MOS transistors have a channel that is present in a horizontal direction along an upper surface of a semiconductor substrate. In contrast, SGTs have a channel that is present in a direction perpendicular to an upper surface of a semiconductor substrate (refer to, for example, Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Therefore, SGTs enable an increase in the density of semiconductor devices compared with planar MOS transistors.

FIG. 6 is a schematic structural view of an N-channel SGT. A Si pillar 100 of a P or i (intrinsic) conductivity type (hereinafter, a silicon semiconductor pillar is referred to as a "Si pillar") includes, in upper and lower portions thereof, $N^+$ layers 101a and 101b one of which functions as a source and the other one of which functions as a drain (hereinafter, a semiconductor region containing a donor impurity at a high concentration is referred to as an "$N^+$ layer"). A portion of the Si pillar 100 between the $N^+$ layers 101a and 101b, which function as a source and a drain, functions as a channel region 102. A gate insulating layer 103 is formed so as to surround the channel region 102. A gate conductor layer 104 is formed so as to surround the gate insulating layer 103. In the SGT, the $N^+$ layers 101a and 101b functioning as the source and the drain, the channel region 102, the gate insulating layer 103, and the gate conductor layer 104 are formed in a single Si pillar 100. Accordingly, in plan view, the area occupied by the SGT corresponds to the area occupied by a single $N^+$ layer of a planar MOS transistor, the $N^+$ layer functioning as a source or a drain. Therefore, an SGT-including circuit chip enables a further reduction in the size of the chip compared with a circuit chip including a planar MOS transistor.

A single memory cell of an SGT-including static random access memory (SRAM) circuit is formed by using six SGTs (refer to, for example, U.S. Patent Application Publication No. 2010/0219483 specification). Usually, SGTs that constitute a memory cell of an SRAM are respectively formed in different semiconductor pillars.

An increase in the density of an SRAM memory cell leads to a reduction in the cost of a semiconductor memory device chip in which an SRAM circuit is incorporated.

Therefore, there has been a demand for realization of a high-density SRAM cell circuit. There has also been a demand for an enhancement in the performance of a semiconductor memory device chip, for example, an increase in the speed of an SRAM cell circuit.

SUMMARY OF THE INVENTION

There has been a demand for realization of an SRAM cell circuit having a higher density and a higher performance.

A pillar-shaped semiconductor memory device according to a first aspect of the present invention includes: a first semiconductor pillar and a second semiconductor pillar that are disposed on a substrate so as to extend in a direction perpendicular to a surface of the substrate; a first SGT and a second SGT each including a portion of the first semiconductor pillar as a channel region; a third SGT including a portion of the first semiconductor pillar as a channel region and formed above the first SGT and the second SGT; a fourth SGT and a fifth SGT each including a portion of the second semiconductor pillar as a channel region; a sixth SGT including a portion of the second semiconductor pillar as a channel region and formed above the fourth SGT and the fifth SGT; a first insulating layer disposed in the first semiconductor pillar between the third SGT and one of the first SGT and the second SGT which is located upper than the other; and a second insulating layer disposed in the second semiconductor pillar between the sixth SGT and one of the fourth SGT and the fifth SGT which is located upper than the other.

In the pillar-shaped semiconductor memory device, the first SGT and the fourth SGT are disposed at the same height in a vertical direction and disposed in parallel in a horizontal direction, the second SGT and the fifth SGT are disposed at the same height in the vertical direction and disposed in parallel in the horizontal direction, the third SGT and the sixth SGT are disposed at the same height in the vertical direction and disposed in parallel in the horizontal direction, a first gate connection wiring layer connected to a gate of the first SGT, a second gate connection wiring layer connected to a gate of the second SGT and overlapping with the first gate connection wiring layer in plan view, the first and second gate connection wiring layers surrounding the first semiconductor pillar, a first impurity region connection wiring layer connected to impurity regions of the fourth SGT and the fifth SGT, the impurity regions being disposed in a connecting portion of the fourth SGT and the fifth SGT, and a second impurity region connection wiring layer connected to a lower impurity region of the sixth SGT and overlapping with the first impurity region connection wiring layer in plan view, the first and second impurity region connection wiring layers surrounding the second semiconductor pillar, extend in one direction and are electrically connected together, a third gate connection wiring layer connected to a gate of the fourth SGT, a fourth gate connection wiring layer connected to a gate of the fifth SGT and overlapping with the third gate connection wiring layer in plan view, the third and fourth gate connection wiring layers surrounding the second semiconductor pillar, a third impurity region connection wiring layer connected to impurity regions of the first SGT and the second SGT, the impurity regions being disposed in a connecting portion of the first SGT and the second SGT, and a fourth impurity region connection wiring layer connected to a lower impurity region of the third SGT and overlapping with the third impurity region connection wiring layer in plan view, the third and fourth impurity region connection wiring layers surrounding the first semiconductor pillar, extend in a direction opposite to the one direction and are electrically connected together, and one of the first SGT and the second SGT functions as a drive transistor and the other functions as a load transistor, one of the fourth SGT and the fifth SGT functions as a drive transistor and the other functions as a load transistor, and the third SGT and the sixth SGT function as selection transistors, thus forming an SRAM cell circuit.

Preferably, in the pillar-shaped semiconductor memory device, the first SGT includes a first impurity region, a second impurity region, a first gate insulating layer surrounding the channel region of the first SGT, and a first gate conductor layer surrounding the first gate insulating layer, the second SGT includes a third impurity region, a fourth impurity region, a second gate insulating layer surrounding the channel region of the second SGT, and a second gate conductor layer surrounding the second gate insulating layer, the third SGT includes a fifth impurity region, a sixth impurity region, a third gate insulating layer surrounding the channel region of the third SGT, and a third gate conductor layer surrounding the third gate insulating layer, the fourth SGT includes a seventh impurity region, an eighth impurity region, a fourth gate insulating layer surrounding the channel region of the fourth SGT, and a fourth gate conductor layer surrounding the fourth gate insulating layer, the fifth SGT includes a ninth impurity region, a tenth impurity region, a fifth gate insulating layer surrounding the channel region of the fifth SGT, and a fifth gate conductor layer surrounding the fifth gate insulating layer, the sixth SGT includes an eleventh impurity region, a twelfth impurity region, a sixth gate insulating layer surrounding the channel region of the sixth SGT, and a sixth gate conductor layer surrounding the sixth gate insulating layer, the first impurity region and the seventh impurity region are connected to a ground wiring conductor layer, the fourth impurity region and the tenth impurity region are connected to a power supply wiring conductor layer, the third gate conductor layer and the sixth gate conductor layer are connected to a word-line wiring conductor layer, one of the sixth impurity region and the twelfth impurity region is connected to a bit-line wiring conductor layer and the other is connected to an inverted bit-line wiring conductor layer, a first wiring conductor layer, which is the first gate connection wiring layer, is formed so as to be connected to the first gate conductor layer, a second wiring conductor layer, which is the third impurity region connection wiring layer, is formed so as to be connected to the second impurity region, a third wiring conductor layer, which is the third impurity region connection wiring layer as in the second wiring conductor layer, is formed so as to be connected to the third impurity region, a fourth wiring conductor layer, which is the second gate connection wiring layer, is formed so as to be connected to the second gate conductor layer, a fifth wiring conductor layer, which is the fourth impurity region connection wiring layer, is formed so as to be connected to the fifth impurity region, a sixth wiring conductor layer is formed so as to be connected to the third gate conductor layer and the sixth gate conductor layer, a seventh wiring conductor layer, which is the third gate connection wiring layer, is formed so as to be connected to the fourth gate conductor layer, an eighth wiring conductor layer, which is the first impurity region connection wiring layer, is formed so as to be connected to the eighth impurity region, a ninth wiring conductor layer, which is the first impurity region connection wiring layer as in the eighth wiring conductor layer, is formed so as to be connected to the ninth impurity region, a tenth wiring conductor layer, which is the fourth gate connection wiring layer, is formed so as to be connected to the fifth gate conductor layer, an eleventh wiring conductor layer, which is the second impurity region connection wiring layer, is formed so as to be connected to the eleventh impurity region, in plan view, the second wiring conductor layer, the third wiring conductor layer, and the fifth wiring conductor layer are formed so as to surround the first semiconductor pillar, to extend in one direction, and to overlap each other, in plan view, the seventh wiring conductor layer and the tenth wiring conductor layer are formed so as to surround the second semiconductor pillar, to extend in the one direction, and to overlap each other, in plan view, the eighth wiring conductor layer, the ninth wiring conductor layer, and the eleventh wiring conductor layer are formed so as to surround the second semiconductor pillar, to extend in a direction opposite to the one direction, and to overlap each other, and in plan view, the first wiring conductor layer and the fourth wiring conductor layer are formed so as to surround the first semiconductor pillar, to extend in the direction opposite to the one direction, and to overlap each other.

The pillar-shaped semiconductor memory device preferably further includes: a first contact hole that connects the third wiring conductor layer and the fifth wiring conductor layer to each other, a second contact hole that connects the seventh wiring conductor layer and the tenth wiring conductor layer to each other, a third contact hole that connects the ninth wiring conductor layer and the eleventh wiring conductor layer to each other, a fourth contact hole that connects the first wiring conductor layer and the fourth wiring conductor layer to each other, a first connection wiring conductor layer that electrically connects the second wiring conductor layer, the third wiring conductor layer, the fifth wiring conductor layer, the seventh wiring conductor layer, and the tenth wiring conductor layer together via the first contact hole and the second contact hole, and a second connection wiring conductor layer that electrically connects the eighth wiring conductor layer, the ninth wiring conductor layer, the eleventh wiring conductor layer, the first wiring conductor layer, and the fourth wiring conductor layer together via the third contact hole and the fourth contact hole.

Preferably, in the pillar-shaped semiconductor memory device, the first impurity region, the second impurity region, the third impurity region, the fourth impurity region, the fifth impurity region, and the sixth impurity region are sequentially formed from a bottom portion of the first semiconductor pillar upward, and the seventh impurity region, the eighth impurity region, the ninth impurity region, the tenth impurity region, the eleventh impurity region, and the twelfth impurity region are sequentially formed from a bottom portion of the second semiconductor pillar upward.

The pillar-shaped semiconductor memory device preferably further includes: a first bottom conductor layer that is connected to the first impurity region and the seventh impurity region and that is formed to be continuous with outer peripheral portions of the first semiconductor pillar and the second semiconductor pillar, and a twelfth wiring conductor layer that is connected to the fourth impurity region and the tenth impurity region and that surrounds the first semiconductor pillar and the second semiconductor pillar.

Preferably, the first bottom conductor layer and the ground wiring conductor layer are connected to each other, and the twelfth wiring conductor layer is connected to the power supply wiring conductor layer.

Preferably, in the pillar-shaped semiconductor memory device, preferably, the fourth impurity region, the third impurity region, the second impurity region, the first impurity region, the fifth impurity region, and the sixth impurity region are sequentially formed from a bottom portion of the first semiconductor pillar upward, and the tenth impurity region, the ninth impurity region, the eighth impurity region, the seventh impurity region, the eleventh impurity region, and the twelfth impurity region are sequentially formed from a bottom portion of the second semiconductor pillar upward.

The pillar-shaped semiconductor memory device preferably further includes: a second bottom conductor layer that is connected to the fourth impurity region and the tenth impurity region and that is formed to be continuous with outer peripheral portions of the first semiconductor pillar and the second semiconductor pillar, and a thirteenth wiring conductor layer that is connected to the first impurity region and the seventh impurity region and that surrounds the first semiconductor pillar and the second semiconductor pillar.

Preferably, the second bottom conductor layer and the power supply wiring conductor layer are connected to each other, and the thirteenth wiring conductor layer is connected to the ground wiring conductor layer.

Preferably, in the pillar-shaped semiconductor memory device, the first contact hole further extends through a wiring conductor layer connected to the fourth impurity region, and/or the third contact hole further extends through a wiring conductor layer connected to the tenth impurity region.

The pillar-shaped semiconductor memory device preferably further includes: a first silicide layer formed in an outer peripheral surface layer of the first semiconductor pillar so as to be connected to the second impurity region and the third impurity region; and a second silicide layer formed in an outer peripheral surface layer of the second semiconductor pillar so as to be connected to the eighth impurity region and the ninth impurity region.

The pillar-shaped semiconductor memory device preferably further includes: a first interlayer insulating layer formed between the second wiring conductor layer and the third wiring conductor layer; a second interlayer insulating layer formed between the eighth wiring conductor layer and the ninth wiring conductor layer; a first through contact hole extending through the second wiring conductor layer, the first interlayer insulating layer, and the third wiring conductor layer; a second through contact hole extending through the eighth wiring conductor layer, the second interlayer insulating layer, and the ninth wiring conductor layer; a first buried conductor layer buried in the first through contact hole; and a second buried conductor layer buried in the second through contact hole.

Preferably, in the pillar-shaped semiconductor memory device, the second wiring conductor layer and the third wiring conductor layer are connected to each other in the vertical direction and formed of the same conductor material layer, and the eighth wiring conductor layer and the ninth wiring conductor layer are connected to each other in the vertical direction and formed of the same conductor material layer.

A method for producing a pillar-shaped semiconductor memory device according to a second aspect of the present invention includes: a step of forming, on a substrate, a first semiconductor pillar and a second semiconductor pillar that extend in a direction perpendicular to a plane of the substrate, that have inner insulating layers which are formed at the same height and which isolate semiconductor layers disposed over and under the inner insulating layers from each other, and that stand adjacent to each other; a step of forming a gate insulating layer so as to surround each of the first semiconductor pillar and the second semiconductor pillar; a step of forming a gate conductor layer so as to surround the gate insulating layer; a step of forming a first impurity region in a bottom portion of the first semiconductor pillar and forming a second impurity region containing an impurity having the same polarity as the first impurity region in a bottom portion of the second semiconductor pillar; a step of forming a third impurity region above the first impurity region and within the first semiconductor pillar, and a fourth impurity region at the same height as the third impurity region and within the second semiconductor pillar, the fourth impurity region containing an impurity having the same polarity as the third impurity region; a step of forming a fifth impurity region above the third impurity region and within the first semiconductor pillar, and a sixth impurity region at the same height as the fifth impurity region and within the second semiconductor pillar, the sixth impurity region containing an impurity having the same polarity as the fifth impurity region; a step of forming a seventh impurity region located upper than the fifth impurity region of the first semiconductor pillar and below the corresponding inner insulating layer, and an eighth impurity region at the same height as the seventh impurity region and within the second semiconductor pillar, the eighth impurity region containing an impurity having the same polarity as the seventh impurity region; a step of forming a ninth impurity region located upper than the corresponding inner insulating layer and within the first semiconductor pillar, and a tenth impurity region at the same height as the ninth impurity region and within the second semiconductor pillar, the tenth impurity region containing an impurity having the same polarity as the ninth impurity region; a step of forming an eleventh impurity region located upper than the ninth impurity region and within the first semiconductor pillar, and a twelfth impurity region at the same height as the eleventh impurity region and within the second semiconductor pillar, the twelfth impurity region containing an impurity having the same polarity as the eleventh impurity region; a step of forming a first wiring conductor layer surrounding a side surface of the third impurity region, a second wiring conductor layer surrounding a side surface of the fifth impurity region, a third wiring conductor layer surrounding a side surface of the fourth impurity region, and a fourth wiring conductor layer surrounding a side surface of the sixth impurity region; a step of forming a fifth wiring conductor layer connected to the gate conductor layer located between the fifth impurity region and the seventh impurity region, and a sixth wiring conductor layer connected to the gate conductor layer located between the sixth impurity region and the eighth impurity region at the height as the fifth wiring conductor layer; a step of forming a seventh wiring conductor layer surrounding a side surface of the seventh impurity region, an eighth wiring conductor layer surrounding a side surface of the ninth impurity region and insulated from the seventh wiring conductor layer, a ninth wiring conductor layer surrounding a side surface of the eighth impurity region, and a tenth wiring conductor layer surrounding a side surface of the tenth impurity region and insulated from the ninth wiring conductor layer; a step of forming a twelfth wiring conductor layer connected to the gate conductor layer between the first impurity region and the third impurity region, and the fifth wiring conductor layer overlapping with the twelfth wiring conductor layer in plan view so as to extend in one direction, and forming the third wiring conductor layer, the fourth wiring conductor layer, and the tenth wiring conductor layer so as to overlap each other and extend in the one direction in plan view; a step of forming a thirteenth wiring conductor layer connected to the gate conductor layer between the second impurity region and the fourth impurity region, and the sixth wiring conductor layer overlapping with the thirteenth wiring conductor layer in plan view so as to extend in a direction opposite to the one direction, and forming the first wiring conductor layer, the second wiring conductor layer, and the eighth wiring conductor layer so as to overlap each other and extend in the direction opposite to the one direction in plan view; a step of connecting the twelfth wiring conductor layer, the fifth wiring conductor layer, the third wiring conductor layer, the fourth wiring conductor layer, and the tenth wiring conductor layer together; and a step of connecting the thirteenth wiring conductor layer, the sixth wiring conductor layer, the first wiring conductor layer, the second wiring conductor layer, and the eighth wiring conductor layer together.

Preferably, in the method for producing a pillar-shaped semiconductor memory device, in the steps of forming the first impurity region to the eighth impurity region, the first impurity region containing a donor impurity atom, the third impurity region containing a donor impurity atom, the fifth impurity region containing an acceptor impurity atom, and the seventh impurity region containing an acceptor impurity atom are formed in the first semiconductor pillar, and the second impurity region containing a donor impurity atom, the fourth impurity region containing a donor impurity atom, the sixth impurity region containing an acceptor impurity atom, and the eighth impurity region containing an acceptor impurity atom are formed in the second semiconductor pillar.

The method preferably further includes: a step of connecting the first impurity region and the second impurity region to a first ground wiring conductor layer, a step of connecting the seventh wiring conductor layer and the ninth wiring conductor layer to a first power supply wiring conductor layer, a step of connecting the eleventh wiring conductor layer to a first word-line wiring conductor layer, and a step of connecting one of the eleventh impurity region and the twelfth impurity region to a first bit-line wiring conductor layer and connecting the other to a first inverted bit-line wiring conductor layer.

Preferably, in the method for producing a pillar-shaped semiconductor memory device, in the steps of forming the first impurity region to the eighth impurity region, the first impurity region containing an acceptor impurity atom, the third impurity region containing an acceptor impurity atom, the fifth impurity region containing a donor impurity atom, and the seventh impurity region containing a donor impurity atom are formed in the first semiconductor pillar, and the second impurity region containing an acceptor impurity atom, the fourth impurity region containing an acceptor impurity atom, the sixth impurity region containing a donor impurity atom, and the eighth impurity region containing a donor impurity atom are formed in the second semiconductor pillar.

The method preferably further includes: a step of connecting the first impurity region and the second impurity region to a second power supply wiring conductor layer, a step of connecting the seventh impurity region and the eighth impurity region to a second ground wiring conductor layer, a step of connecting the eleventh wiring conductor layer to a second word-line wiring conductor layer, and a step of connecting one of the eleventh impurity region and the twelfth impurity region to a second bit-line wiring conductor layer and connecting the other to a second inverted bit-line wiring conductor layer.

The method for producing a pillar-shaped semiconductor memory device preferably further includes: a step of forming, in a side surface of the first semiconductor pillar, a first silicide region connected to the third impurity region and the fifth impurity region; a step of forming, in a side surface of the second semiconductor pillar, a second silicide region connected to the fourth impurity region and the sixth impurity region; a step of forming, on the twelfth wiring conductor layer, a first contact hole extending through the fifth wiring conductor layer; step of forming, on the thirteenth wiring conductor layer, a second contact hole extending through the sixth wiring conductor layer; a step of forming, on the second wiring conductor layer surrounding the first semiconductor pillar, a third contact hole extending through the seventh wiring conductor layer and the eighth wiring conductor layer; a step of forming, on the fourth wiring conductor layer surrounding the second semiconductor pillar, a fourth contact hole extending through the ninth wiring conductor layer and the tenth wiring conductor layer; a step of forming a fifth contact hole on the eighth wiring conductor layer so as to surround an outer periphery of the third contact hole in plan view; a step of forming a sixth contact hole on the tenth wiring conductor layer so as to surround an outer periphery of the fourth contact hole in plan view; a step of forming a first contact hole side surface insulating layer on inner side surfaces of the third contact hole and the fifth contact hole; a step of forming a second contact hole side surface insulating layer on inner side surfaces of the fourth contact hole and the sixth contact hole; a step of forming a first wiring-conductor-layer-connecting conductor layer that connects the twelfth wiring conductor layer, the fifth wiring conductor layer, the third wiring conductor layer, and the fourth wiring conductor layer together via the first contact hole, the fourth contact hole, and the sixth contact hole; and a step of forming a second wiring-conductor-layer-connecting conductor layer that connects the thirteenth wiring conductor layer, the sixth wiring conductor layer, the first wiring conductor layer, and the second wiring conductor layer together via the second contact hole, the third contact hole, and the fifth contact hole.

The method for producing a pillar-shaped semiconductor memory device preferably further includes: a step of forming a seventh contact hole extending through the first wiring conductor layer and the second wiring conductor layer; a step of forming an eighth contact hole extending through the third wiring conductor layer and the fourth wiring conductor layer; and a step of filling each of the seventh contact hole and the eighth contact hole with a buried conductor layer.

The method for producing a pillar-shaped semiconductor memory device preferably further includes: a step of forming the first wiring conductor layer and the second wiring conductor layer that are formed of the same conductor material layer so as to be connected to each other in a vertical direction, and forming the third wiring conductor layer and the fourth wiring conductor layer that are formed of the same conductor material layer so as to be connected to each other in the vertical direction.

According to the aspects of the present invention, in an SGT-including pillar-shaped semiconductor memory device, one memory cell is formed by at least two semiconductor pillars. With this structure, a high-density SRAM cell circuit is realized.

BRIEF DESCRIPTION OF THE DRAWINGS

FIG. 2KA and FIGS. 2KB to 2KD are respectively a plan view and sectional structural views that illustrate the method for producing an SGT-including pillar-shaped semiconductor memory device according to the first embodiment.

FIG. 2LA and FIGS. 2LB to 2LD are respectively a plan view and sectional structural views that illustrate the method for producing an SGT-including pillar-shaped semiconductor memory device according to the first embodiment.

FIG. 2QA and FIGS. 2QB to 2QE are respectively a plan view and sectional structural views that illustrate the method for producing an SGT-including pillar-shaped semiconductor memory device according to the first embodiment.

FIG. 5A and FIGS. 5B to 5F are respectively a plan view and sectional structural views that illustrate a method for producing an SGT-including pillar-shaped semiconductor memory device according to a fourth embodiment.

DETAILED DESCRIPTION OF THE PREFERRED EMBODIMENTS

Hereinafter, methods for producing an SGT-including pillar-shaped semiconductor memory device according to embodiments of the present invention will be described with reference to the drawings.

First Embodiment

A method for producing an SGT-including pillar-shaped semiconductor memory device according to a first embodiment of the present invention will now be described with reference to FIG. 1A, FIG. 1B, and FIGS. 2AA to 2SF.

Figure 1A:
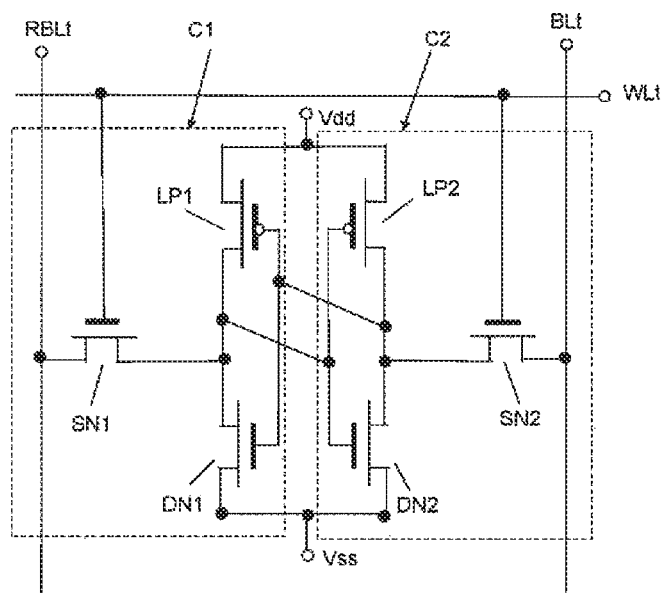
FIG. 1A is an SRAM cell circuit diagram that illustrates an SGT-including pillar-shaped semiconductor memory device according to a first embodiment of the present invention.

FIG. 1A is an SRAM cell circuit diagram according to this embodiment. This SRAM cell circuit includes two inverter circuits. One of the inverter circuits is constituted by a P-channel SGT LP1 functioning as a load transistor and an N-channel SGT DN1 functioning as a drive transistor. The other of the inverter circuits is constituted by a P-channel SGT LP2 functioning as a load transistor and an N-channel SGT DN2 functioning as a drive transistor. The gate of the P-channel SGT LP1 and the gate of the N-channel SGT DN1 are connected to each other. The gate of the P-channel SGT LP2 and the gate of the N-channel SGT DN2 are connected to each other. The drain of the P-channel SGT LP1 and the drain of the N-channel SGT DN1 are connected to each other. The drain of the P-channel SGT LP2 and the drain of the N-channel SGT DN2 are connected to each other.

As illustrated in FIG. 1A, the sources of the P-channel SGTs LP1 and LP2 are connected to a power supply terminal Vdd. The sources of the N-channel SGTs DN1 and DN2 are connected to a ground terminal Vss. N-channel SGTs SN1 and SN2 functioning as selection transistors are arranged on both sides of the two inverter circuits. The gates of the N-channel SGTs SN1 and SN2 are connected to a word-line terminal WLt. The drain of the N-channel SGT SN1 is connected to the drains of the N-channel SGT DN1 and the P-channel SGT LP1. The source of the N-channel SGT SN1 is connected to an inverted bit line terminal RBLt. The drain of the N-channel SGT SN2 is connected the drains of the N-channel SGT DN2 and the P-channel SGT LP2. The source of the N-channel SGT SN2 is connected to a bit line terminal BLt.

As described above, the circuit including an SRAM cell (hereinafter, referred to as an "SRAM cell circuit") according to this embodiment is constituted by a total of six SGTs which are two P-channel SGTs LP1 and LP2 and four N-channel SGTs DN1, DN2, SN1, and SN2. This SRAM cell circuit is constituted by a circuit area C1 including the P-channel SGT LP1 and the N-channel SGTs DN1 and SN1, and a circuit area C2 including the P-channel SGT LP2 and the N-channel SGTs DN2 and SN2.

Figure 1B:
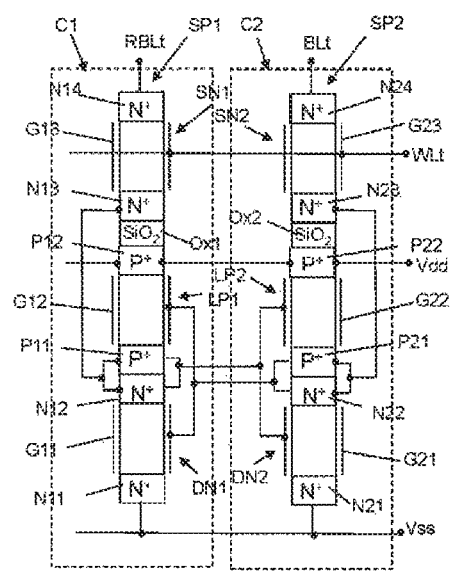
FIG. 1B is a schematic structural view of an SRAM cell circuit, the structural view illustrating an SGT-including pillar-shaped semiconductor memory device according to the first embodiment.

FIG. 1B is a schematic structural view of an SRAM cell circuit according to the first embodiment. This SRAM cell circuit is constituted by two Si pillars SP1 and SP2.

In the Si pillar SP1, the N-channel SGT DN1 illustrated in FIG. 1A is formed in a bottom portion, the P-channel SGT LP1 is formed in a portion on the N-channel SGT DN1, and the N-channel SGT SN1 is formed in a portion above the P-channel SGT LP1. In the Si pillar SP2, the N-channel SGT DN2 illustrated in FIG. 1A is formed in a bottom portion, the P-channel SGT LP2 is formed in a portion on the N-channel SGT DN2, and the N-channel SGT SN2 is formed in a portion above the P-channel SGT LP2.

The N-channel SGT DN1 is formed by a portion of the Si pillar SP1, the portion functioning as a channel and being surrounded by a gate G11, the gate G11, and a source $N^+$ layer N11 and a drain $N^+$ layer N12, which are present over and under the gate G11 and in the Si pillar SP1. The P-channel SGT LP1 is formed by a portion of the Si pillar SP1, the portion functioning as a channel and being surrounded by a gate G12, the gate G12, and a drain $P^+$ layer P11 and a source $P^+$ layer P12, which are present over and under the gate G12 and in the Si pillar SP1. The N-channel SGT SN1 is formed by a portion of the Si pillar SP1, the portion functioning as a channel and being surrounded by a gate G13, the gate G13, and a drain $N^+$ layer N13 and a source $N^+$ layer N14, which are present over and under the gate G13 and in the Si pillar SP1. The $N^+$ layer N12 and the $P^+$ layer P11 are connected to each other. A $SiO_2$ layer Ox1 is formed between the $N^+$ layer N13 and the $P^+$ layer P12.

The N-channel SGT DN2 is formed by a portion of the Si pillar SP2, the portion functioning as a channel and being surrounded by a gate G21, the gate G21, and a source $N^+$ layer N21 and a drain $N^+$ layer N22, which are present over and under the gate G21 and in the Si pillar SP2. The P-channel SGT LP2 is formed by a portion of the Si pillar SP2, the portion functioning as a channel and being surrounded by a gate G22, the gate G22, and a drain $P^+$ layer P21 and a source $P^+$ layer P22, which are present over and under the gate G22 and in the Si pillar SP2. The N-channel SGT SN2 is formed by a portion of the Si pillar SP2, the portion functioning as a channel and being surrounded by a gate G23, the gate G23, and a drain $N^+$ layer N23 and a source $N^+$ layer N24, which are present over and under the gate G23 and in the Si pillar SP2. The $N^+$ layer N22 and the $P^+$ layer P21 are connected to each other. A $SiO_2$ layer Ox2 is formed between the $N^+$ layer N23 and the $P^+$ layer P22.

As illustrated in FIG. 1B, the $N^+$ layer N12, the $P^+$ layer P11, the $N^+$ layer N13, the gate G21, and the gate G22 are connected together, and the $N^+$ layer N22, the $P^+$ layer P21, the $N^+$ layer N23, the gate G11, and the gate G12 are connected together. The $N^+$ layer N11 and the $N^+$ layer N21 are connected to a ground terminal Vss. The $P^+$ layer P12 and the $P^+$ layer P22 are connected to a power supply terminal Vdd. The gate G13 and the gate G23 are connected to a word-line terminal WLt. The $N^+$ layer N24 is connected to a bit line terminal BLt. The $N^+$ layer N14 is connected to an inverted bit line terminal RBLt. With this structure, the SRAM cell circuit illustrated in FIG. 1A is formed. As illustrated in FIG. 1B, the circuit area C1 in FIG. 1A is formed in the Si pillar SP1, and the circuit area C2 is formed in the Si pillar SP2.

In this embodiment, as illustrated in FIG. 1B, the circuit area C1 and the circuit area C2 are respectively formed in the Si pillar SP1 and the Si pillar SP2 so as to have the same arrangement and configuration.

Figure 2A:
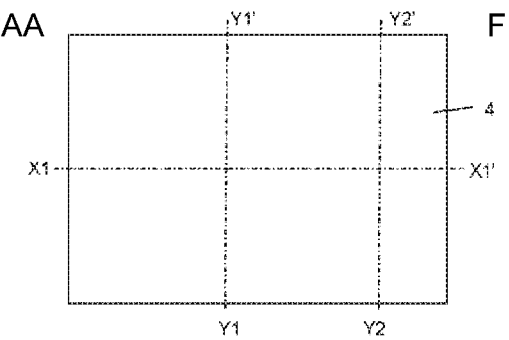
FIG. 2AA and FIGS. 2AB to 2AD are respectively a plan view and sectional structural views that illustrate a method for producing an SGT-including pillar-shaped semiconductor memory device according to the first embodiment.
Figure 2A:
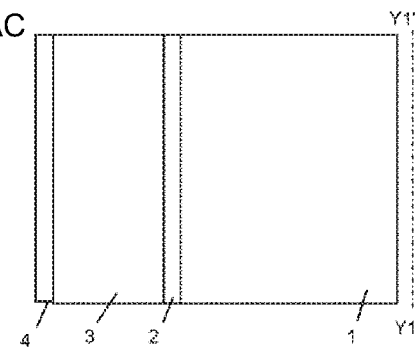
Figure 2A:
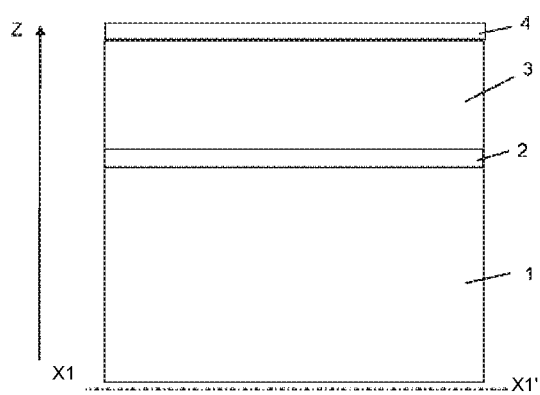
Figure 2A:
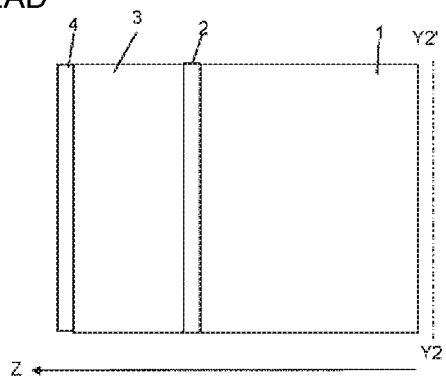

FIGS. 2AA to 2SF are plan views and sectional views for illustrating steps of producing an SGT-including pillar-shaped semiconductor memory device according to this embodiment. Among FIG. 2AA to FIG. 2SF, figures suffixed with the letter A are plan views, figures suffixed with the letter B are sectional structural views taken along lines X1-X1' in the corresponding figures suffixed with the letter A, figures suffixed with the letter C are sectional structural views taken along lines Y1-Y1' in the corresponding figures suffixed with the letter A, and figures suffixed with the letter D are sectional structural views taken along lines Y2-Y2' in the corresponding figures suffixed with the letter A. If present, figures suffixed with the letter E are sectional structural views taken along lines X2-X2' in the corresponding figures suffixed with the letter A, and figures suffixed with the letter F are sectional structural views taken along lines Y3-Y3' in the corresponding figures suffixed with the letter A.

As illustrated in FIGS. 2AA to 2AD, on a Si layer substrate 1 (hereinafter, referred to as an "i layer substrate 1"), a $SiO_2$ layer 2, an i layer 3, and a $SiO_2$ layer 4 are formed to be stacked.

Figure 2B:
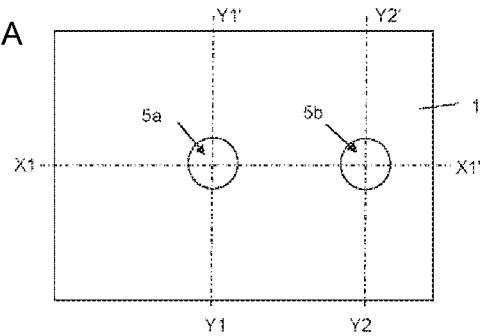
FIG. 2BA and FIGS. 2BB to 2BD are respectively a plan view and sectional structural views that illustrate the method for producing an SGT-including pillar-shaped semiconductor memory device according to the first embodiment.
Figure 2B:
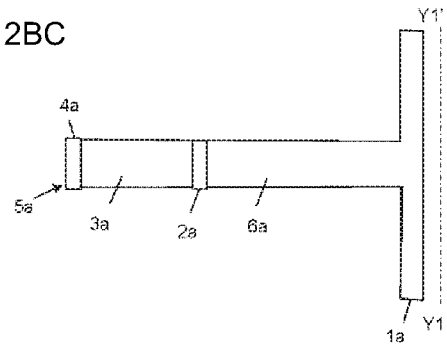
Figure 2B:
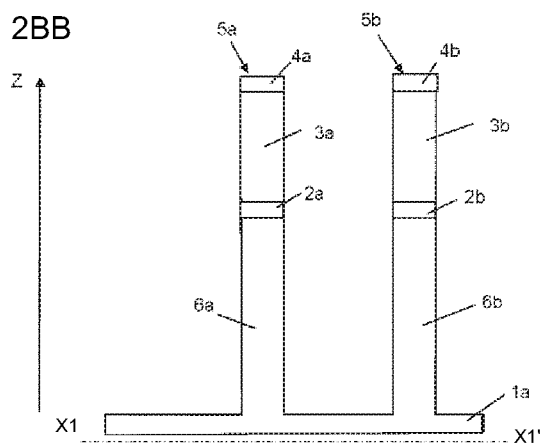
Figure 2B:
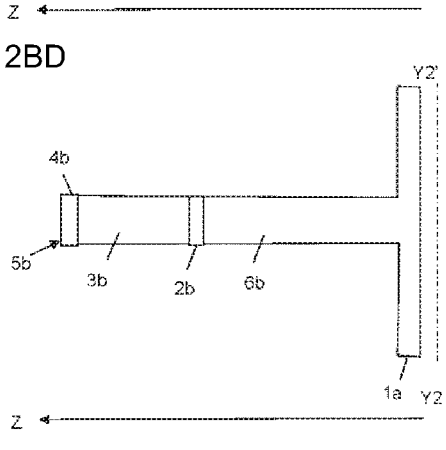

Subsequently, as illustrated in FIGS. 2BA to 2BD, a lithographic process and a reactive ion etching (RIE) process are performed by using a resist layer (not shown) as a mask to form $SiO_2$ layers 4a and 4b, which are circular in plan view. Subsequently, the i layer substrate 1, the $SiO_2$ layer 2, and the i layer 3 are etched by an RIE process using the resist layer and the $SiO_2$ layers 4a and 4b as a mask so that an i layer substrate 1a is left on the i layer substrate 1 to form Si pillars 5a and 5b. As a result, the Si pillar 5a includes an i layer 6a, a $SiO_2$ layer 2a, an i layer 3a, and the $SiO_2$ layer 4a, and the Si pillar 5b includes an i layer 6b, a $SiO_2$ layer 2b, an i layer 3b, and the $SiO_2$ layer 4b.

Figure 2C:
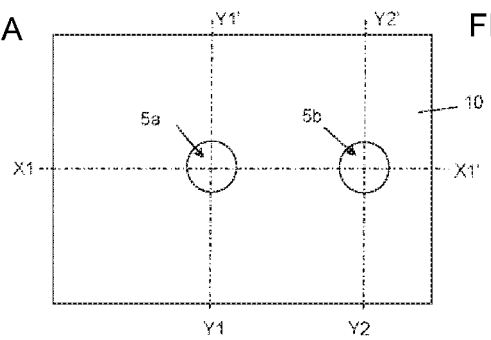
FIG. 2CA and FIGS. 2CB to 2CD are respectively a plan view and sectional structural views that illustrate the method for producing an SGT-including pillar-shaped semiconductor memory device according to the first embodiment.
Figure 2C:
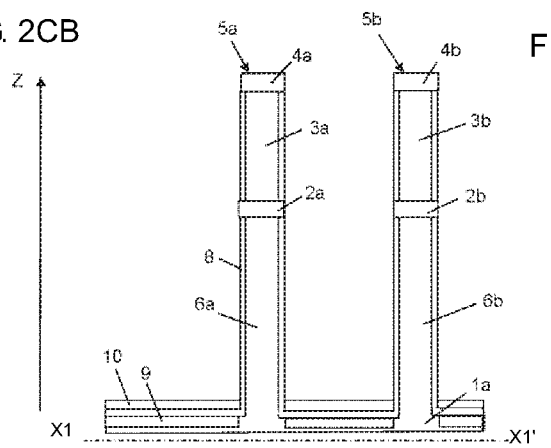
Figure 2C:
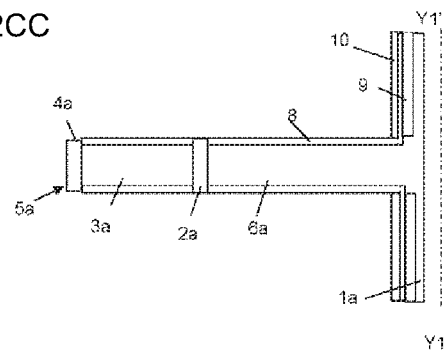
Figure 2C:
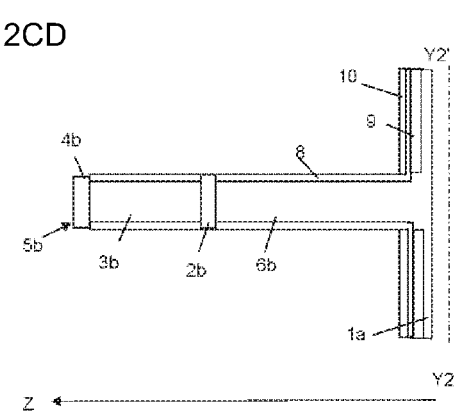

Subsequently, as illustrated in FIGS. 2CA to 2CD, a $SiO_2$ layer 8 is formed by, for example, thermal oxidation, on the side surfaces of the i layers 6a and 3a of the Si pillar 5a, the side surfaces of the i layers 6b and 3b of the Si pillar 5b, and the i layer substrate 1a. Subsequently, an ion implantation process is performed to form an $N^+$ layer 9 in a surface layer of the i layer substrate 1a in outer peripheral portions around the Si pillars 5a and 5b. Subsequently, a $SiO_2$ layer 10 is formed on the SiO$_2$ layer 8 in the outer peripheral portions around the Si pillars 5a and 5b.

Figure 2D:
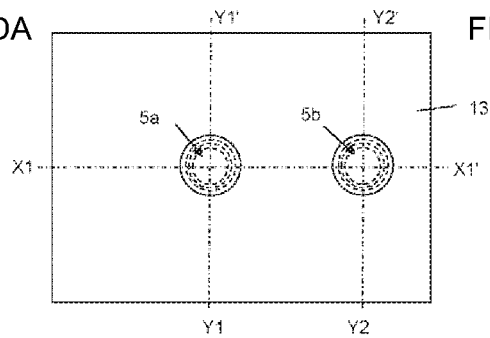
FIG. 2DA and FIGS. 2DB to 2DD are respectively a plan view and sectional structural views that illustrate the method for producing an SGT-including pillar-shaped semiconductor memory device according to the first embodiment.
Figure 2D:
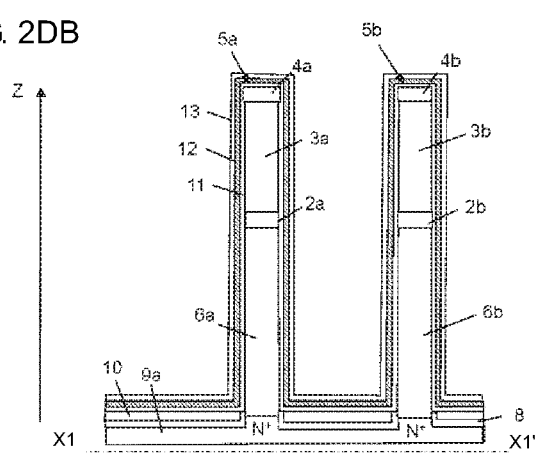
Figure 2D:
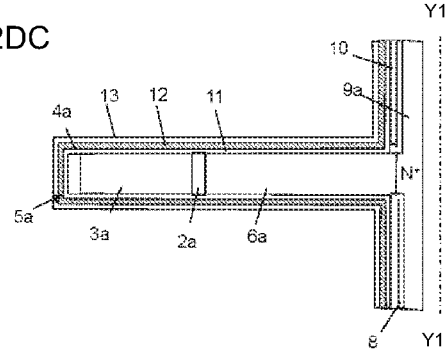
Figure 2D:
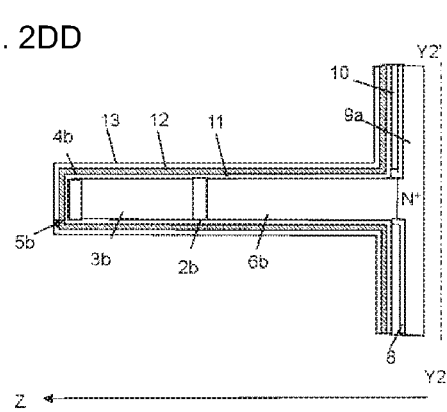

Subsequently, as illustrated in FIGS. 2DA to 2DD, a donor impurity in the N$^+$ layer 9 is thermally diffused by performing a heat treatment to form an N$^+$ layer 9a. Subsequently, after a portion of the SiO$_2$ layer 8 located above the SiO$_2$ layer 10 is removed, a hafnium oxide (HfO$_2$) layer 11, a titanium nitride (TiN) layer 12, and a SiO$_2$ layer 13 are sequentially formed by, for example, an atomic layer deposition (ALD) process so as to cover the Si pillars 5a and 5b and the SiO$_2$ layer 10. Lastly, the HfO$_2$ layer 11 will function as gate insulating layers of SGTs and the TiN layer 12 will function as gate conductor layers of SGTs.

Figure 2E:
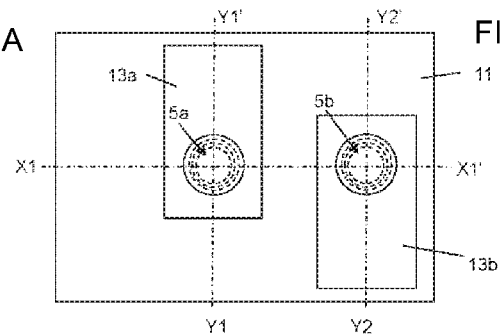
FIG. 2EA and FIGS. 2EB to 2ED are respectively a plan view and sectional structural views that illustrate the method for producing an SGT-including pillar-shaped semiconductor memory device according to the first embodiment.
Figure 2E:
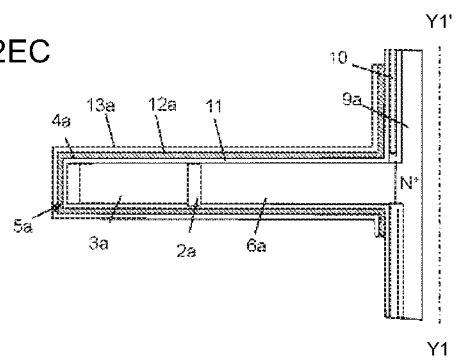
Figure 2E:
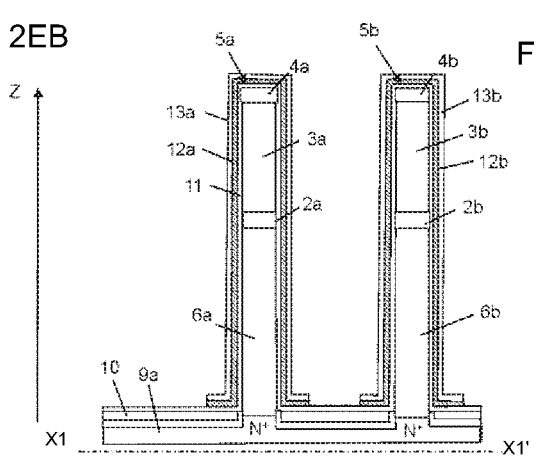
Figure 2E:
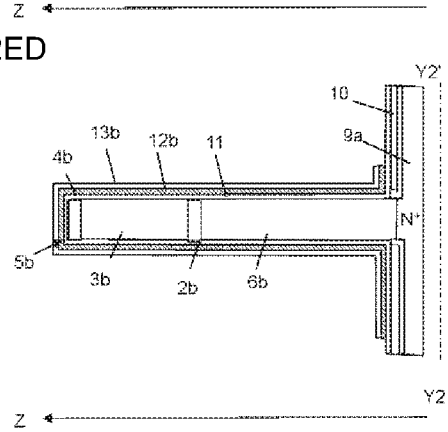

Subsequently, as illustrated in FIGS. 2EA to 2ED, a lithographic process and an RIE process are performed to form a TiN layer 12a, a SiO$_2$ layer 13a, a TiN layer 13a, and a SiO$_2$ layer 13b. In this case, the TiN layer 12a and the SiO$_2$ layer 13a are formed so as to surround the outer periphery of a bottom portion of the Si pillar 5a and to extend in the vertical direction (line Y1-Y1' direction) in plan view, and the TiN layer 12b and the SiO$_2$ layer 13b are formed so as to surround the outer periphery of a bottom portion of the Si pillar 5b and to extend in the vertical direction (line Y2-Y2' direction) in plan view. In plan view, the direction in which the TiN layer 12a and the SiO$_2$ layer 13a extend in the outer periphery of the bottom portion of the Si pillar 5a is opposite to the direction in which the TiN layer 12b and the SiO$_2$ layer 13b extend in the outer periphery of the bottom portion of the Si pillar 5b.

Figure 2F:
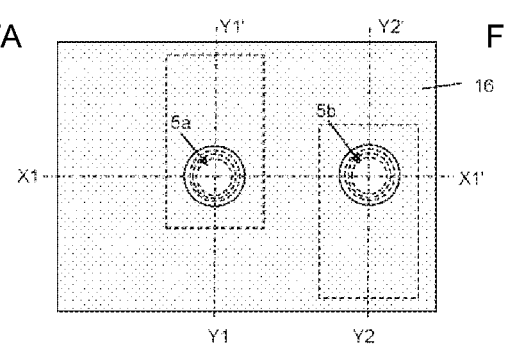
FIG. 2FA and FIGS. 2FB to 2FD are respectively a plan view and sectional structural views that illustrate the method for producing an SGT-including pillar-shaped semiconductor memory device according to the first embodiment.
Figure 2F:
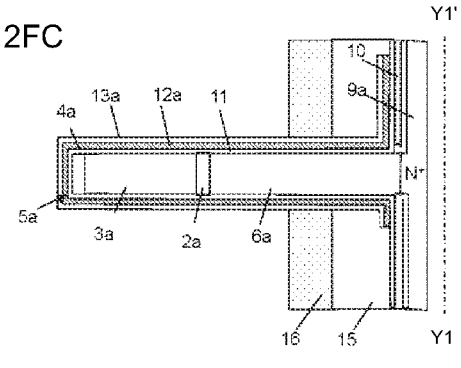
Figure 2F:
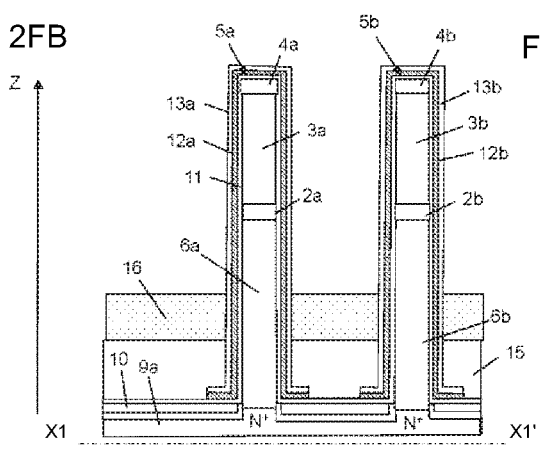
Figure 2F:
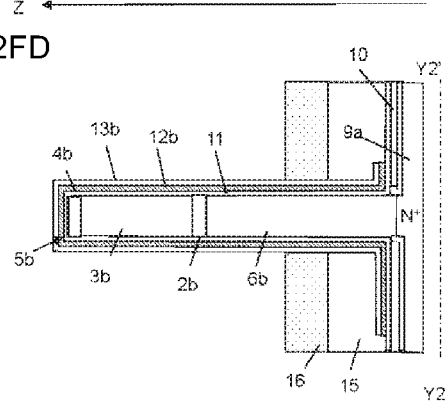

Subsequently, as illustrated in FIGS. 2FA to 2FD, a silicon nitride (SiN) layer 15 is formed on the outer peripheries of the Si pillars 5a and 5b. Subsequently, a resist layer 16 is formed on the SiN layer 15. The resist layer 16 is formed by applying a resist material to upper surfaces of the Si pillars 5a and 5b and the SiN layer 15, and then performing a heat treatment at, for example, 200° C. to increase fluidity of the resist material so that the resist material is uniformly distributed over the SiN layer 15 disposed outside the Si pillars 5a and 5b. Subsequently, hydrogen fluoride gas (hereinafter, referred to as an "HF gas") is supplied to the whole structure. Subsequently, a heating environment at, for example, 180° C. is formed, so that the HF gas is ionized by moisture contained in the resist layer 16 to generate hydrogen fluoride ions (HF$_2^+$) (hereinafter, referred to as "HF ions"). These HF ions diffuse in the resist layer 16 to etch portions of the SiO$_2$ layers 13a and 13b that are in contact with the resist layer 16 (regarding the mechanism of this etching, refer to Tadashi Shibata, Susumu Kohyama, and Hisakazu Iizuka: "A New Field Isolation Technology for High Density MOS LSI", Japanese Journal of Applied Physics, Vol. 18, pp. 263-267 (1979)). On the other hand, the SiO$_2$ layers 13a and 13b that are not in contact with the resist layer 16 are substantially left without being etched. Subsequently, the resist layer 16 is removed.

Figure 2G:
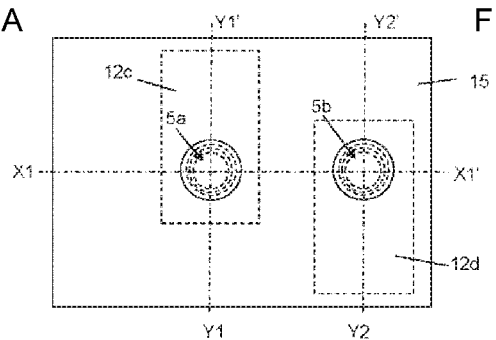
FIG. 2GA and FIGS. 2GB to 2GD are respectively a plan view and sectional structural views that illustrate the method for producing an SGT-including pillar-shaped semiconductor memory device according to the first embodiment.
Figure 2G:
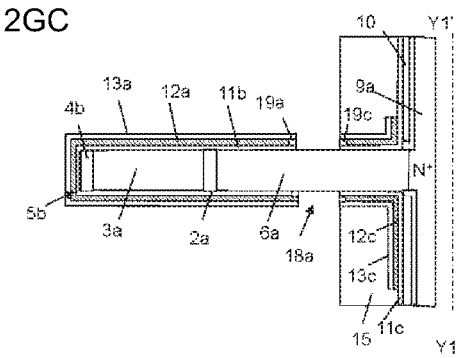
Figure 2G:
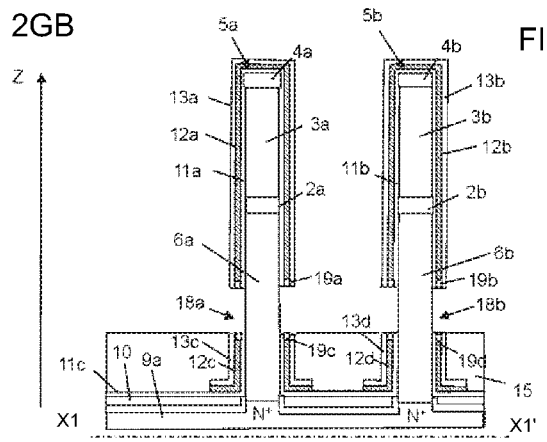
Figure 2G:
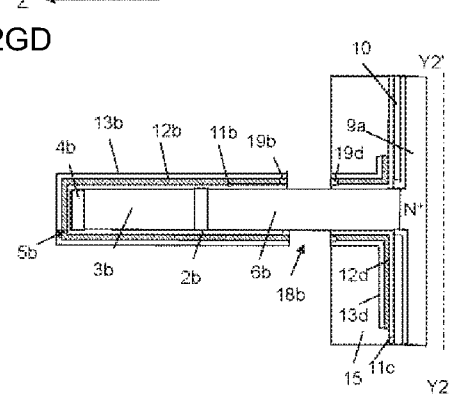

As a result, as illustrated in FIGS. 2GA to 2GD, the SiO$_2$ layer 13a is divided into a SiO$_2$ layer 13c, which is covered with the SiN layer 15, and a SiO$_2$ layer 13a, which is disposed on upper region of the Si pillar 5a, and the SiO$_2$ layer 13b is divided into a SiO$_2$ layer 13d, which is covered with the SiN layer 15, and a SiO$_2$ layer 13b, which is disposed on an upper region of the Si pillar 5b. Subsequently, the TiN layers 12a and 12b are etched by using the SiO$_2$ layers 13a, 13b, 13c, and 13d and the SiN layer 15 as a mask. As a result, a TiN layer 12c, which is covered with the SiN layer 15 disposed on a lower region of the Si pillar 5a, is isolated from the TiN layer 12a covered with the SiO$_2$ layer 13a. Similarly, a TiN layer 12d, which is covered with the SiN layer 15 disposed on a lower region of the Si pillar 5b, is isolated from the TiN layer 12b covered with the SiO$_2$ layer 13b. Subsequently, the HfO$_2$ layer 11 is etched by using the SiO$_2$ layers 13a and 13b, the TiN layers 12a and 12b, the SiO$_2$ layers 13c and 13d, the TiN layers 12c and 12d, and the SiN layer 15 as a mask. As a result, the HfO$_2$ layer 11 is divided into a HfO$_2$ layer 11c, which is disposed on a lower region of the Si pillars 5a and 5b, and HfO$_2$ layers 11a and 11b, which are respectively disposed on upper regions of the Si pillars 5a and 5b. Subsequently, exposed portions of the TiN layers 12a and 12c around the Si pillar 5a, and exposed portions of the TiN layers 12b and 12d around the Si pillar 5b are oxidized to form TiO (titanium oxide) layers 19a, 19b, 19c, and 19d, respectively. As a result, openings 18a and 18b are formed on the Si pillars 5a and 5b, respectively.

Figure 2H:
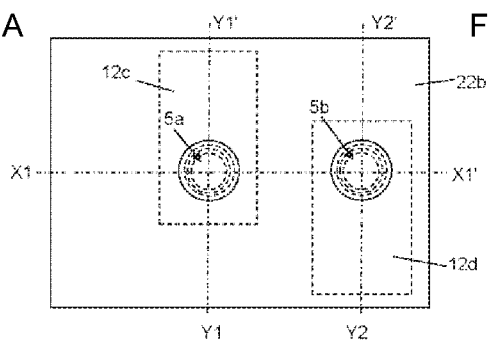
FIG. 2HA and FIGS. 2HB to 2HD are respectively a plan view and sectional structural views that illustrate the method for producing an SGT-including pillar-shaped semiconductor memory device according to the first embodiment.
Figure 2H:
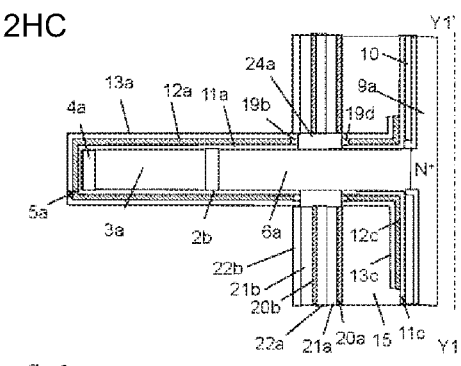
Figure 2H:
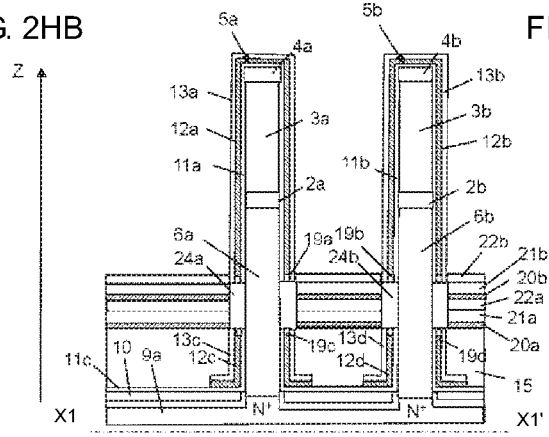
Figure 2H:
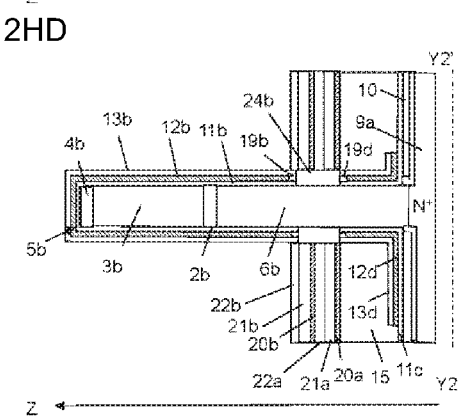

Subsequently, as illustrated in FIGS. 2HA to 2HD, Ni atoms are directed to the upper surface of the i layer substrate 1a in a direction perpendicular to the upper surface by using, for example, a bias sputtering process to form a Ni layer 20a on the SiN layer 15. The bias sputtering process is performed as follows. A substrate metal plate on which the i layer substrate 1a (not shown, corresponding to the i layer substrate 1a in FIGS. 2BB to 2BD) is disposed and a facing metal plate separated from the substrate metal plate are prepared; a direct-current voltage is applied to the substrate metal plate; and an RF voltage is applied between the two parallel metal plates to sputter the material atoms of the facing metal plate, thus depositing the material atoms on the i layer substrate 1a. Similarly, an N-type poly-Si layer 21a containing arsenic (As) as an impurity, a SiO$_2$ layer 22a, a Ni layer 20b, a P-type poly-Si layer 21b containing boron (B) as an impurity, and a SiO$_2$ layer 22b are sequentially stacked by the bias sputtering process. Here, the SiO$_2$ layer 22b is formed such that the upper surface thereof is in contact with the SiO$_2$ layers 13a and 13b, which cover upper portions of the Si pillars 5a and 5b. The Ni atoms, the poly-Si atoms, and the SiO$_2$ atoms are directed in a direction perpendicular to the upper surface of the i layer substrate 1a. As a result, sealed spaces 24a and 24b are formed between the outer peripheral side surfaces of the Si pillars 5a and 5b and the Ni layers 20a and 20b, the poly-Si layers 21a and 21b, and the SiO$_2$ layers 22a and 22b. Subsequently, stacked films (not shown) are removed, the stacked films being formed over the top of the Si pillars 5a and 5b during the formation of the stacked films constituted by the Ni layers 20a and 20b, the poly-Si layers 21a and 21b, and the SiO$_2$ layers 22a and 22b.

Figure 2I:
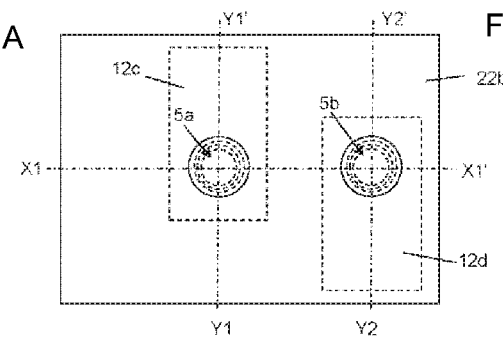
FIG. 2IA and FIGS. 2IB to 2ID are respectively a plan view and sectional structural views that illustrate the method for producing an SGT-including pillar-shaped semiconductor memory device according to the first embodiment.
Figure 2I:
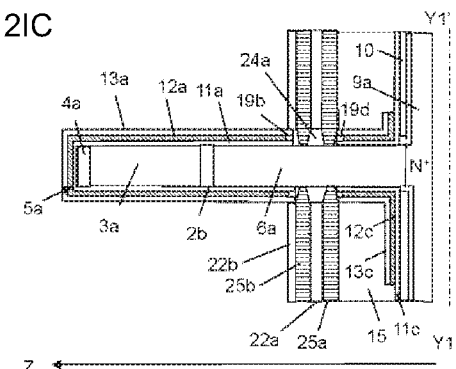
Figure 2I:
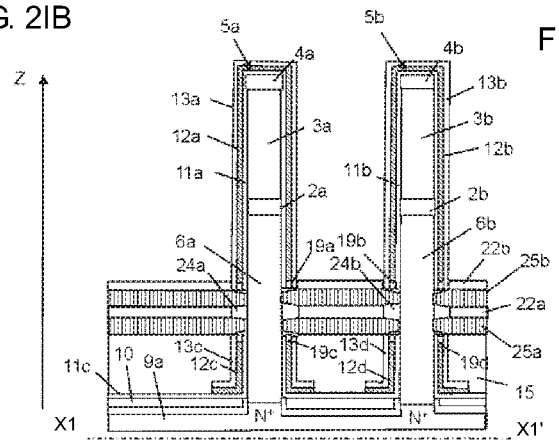
Figure 2I:
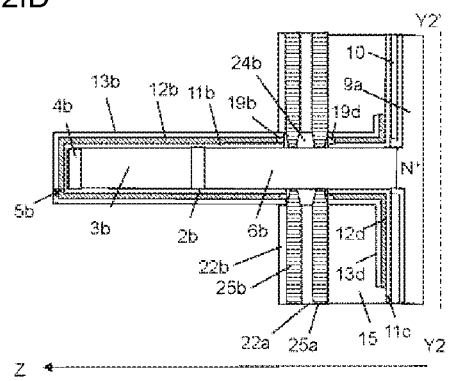

Subsequently, as illustrated in FIGS. 2IA to 2ID, a heat treatment at, for example, 550° C. is performed, so that Ni atoms in the Ni layers 20a and 20b are diffused into the N-type poly-Si layer 21a and the P-type poly-Si layer 21b to form nickel silicide (NiSi) layers 25a and 25b, respectively. The NiSi layers 25a and 25b have expanded volumes compared with the volumes of the N-type poly-Si layer 21a and the P-type poly-Si layers 21b, respectively (regarding this volume expansion, refer to T. Morimoto, T. Ohguro, H. Sasaki, M. S. Momose, T. Iinuma, I. Kunishima, K. Suguro, I. Katakabe, H. Nakajima, M. Tsuchiaki, M. Ono, Y. Katsumata, and H. Iwai: "Self-Aligned Nickel-Mono-Silicide Technology for High-Speed Deep Submicrometer Logic CMOS ULSI" IEEE Transaction on Electron Devices, Vol. 42, No. 5, pp. 915-922 (1995)). Since the N-type poly-Si layer 21a and the P-type poly-Si layer 21b are disposed between the SiN layer 15 and the SiO$_2$ layers 22a and 22b, the NiSi layers 25a and 25b mainly protrude into the spaces 24a and 24b. The As atoms contained in N-type poly-Si layer 21a and the B atoms contained in the P-type poly-Si layer 21b are pushed outward in the NiSi layers 25a and 25b (regarding this push-out phenomenon, refer to T. Morimoto, T. Ohguro, H. Sasaki, M. S. Momose, T. Iinuma, I. Kunishima, K. Suguro, I. Katakabe, H. Nakajima, M. Tsuchiaki, M. Ono, Y. Katsumata, and H. Iwai: "Self-Aligned Nickel-Mono-Silicide Technology for High-Speed Deep Submicrometer Logic CMOS ULSI" IEEE Transaction on Electron Devices, Vol. 42, No. 5, pp. 915-922 (1995)). As a result of this impurity atom push-out effect, protrusions (not shown) having high contents of impurity atoms are formed in the surface layers of the side surfaces of the NiSi layers 25a and 25b, which protrude into the spaces 24a and 24b. The side surfaces of the protrusions are in contact with the side surfaces of the Si pillars 5a and 5b.

Figure 2J:
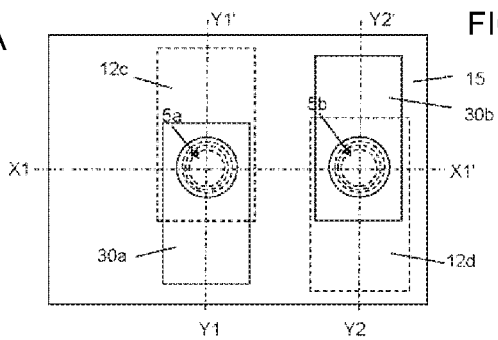
FIG. 2JA and FIGS. 2JB to 2JD are respectively a plan view and sectional structural views that illustrate the method for producing an SGT-including pillar-shaped semiconductor memory device according to the first embodiment.
Figure 2J:
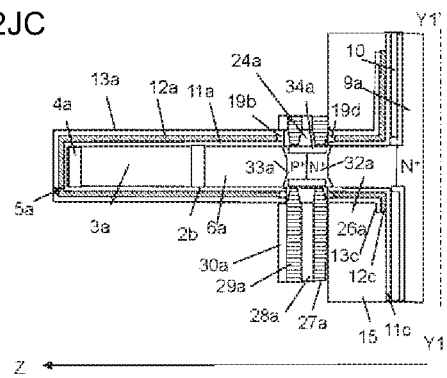
Figure 2J:
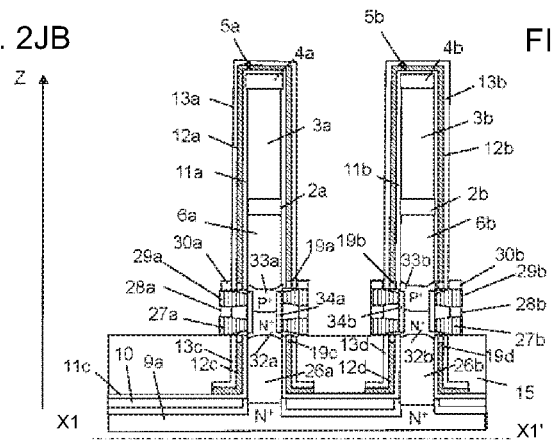
Figure 2J:
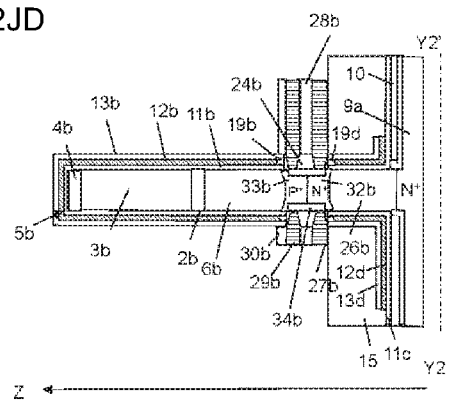

Subsequently, as illustrated in FIGS. 2JA to 2JD, a heat treatment is performed to cause silicide expansion of the NiSi layers 25a and 25b, and to diffuse, by the impurity push-out effect, As atoms and B atoms from the protrusions into the Si pillars 5a and 5b. As a result, NiSi layers 34a and 34b are respectively formed in the surface layers of the side surfaces of the Si pillars 5a and 5b in contact with the NiSi layers 25a and 25b; and B atoms and As atoms are diffused, by the impurity push-out effect, into the Si pillars 5a and 5b to form $N^+$ layers 32a and 32b and $P^+$ layers 33a and 33b in the Si pillars 5a and 5b. As a result, i layers 26a and 26b between the $N^+$ layer 9a and the $N^+$ layers 32a and 32b are respectively isolated from the i layers 6a and 6b. Subsequently, the NiSi layers 25a and 25b and the $SiO_2$ layers 22a and 22b are patterned by using a lithographic process and an RIE process to form NiSi layers 27a and 29a and $SiO_2$ layers 28a and 30a that remain on outer peripheral portions around the Si pillar 5a and that extend in the vertical direction (line Y1-Y1' direction) in plan view and NiSi layers 27b and 29b and $SiO_2$ layers 28b and 30b that remain on outer peripheral portions around the Si pillar 5b and that extend in the vertical direction (line Y2-Y2' direction) in plan view. The direction in which the NiSi layers 27a and 29a and the $SiO_2$ layers 28a and 30a extend is opposite to the direction in which the TiN layer 12c extends. The direction in which the NiSi layers 27b and 29b and the $SiO_2$ layers 28b and 30b extend is opposite to the direction in which the TiN layer 12d extends.

Subsequently, as illustrated in FIGS. 2KA to 2KD, a SiN layer 35 is formed by using the same process as in the formation of the SiN layer 15 such that the upper surface thereof is positioned in the middle of the $SiO_2$ layers 30a and 30b and the $SiO_2$ layers 2a and 2b in the height direction. Subsequently, openings are formed in the outer peripheries of the TiN layers 12a and 12b by using the same process as in the formation of the spaces 24a and 24b. Subsequently, a NiSi layer 36a in contact with the TiN layer 12a, a $SiO_2$ layer 37a in contact with the $SiO_2$ layer 13a, a NiSi layer 36b in contact with the TiN layer 12b, and $SiO_2$ layer 37b in contact with the $SiO_2$ layer 13b are formed.

Subsequently, as illustrated in FIGS. 2LA to 2LD, a SiN layer 38 is formed on the SiN layer 35 such that the upper surface thereof is positioned lower than the $SiO_2$ layers 2a and 2b. Subsequently, openings having upper and lower ends thereof at the top and the bottom of the $SiO_2$ layers 2a and 2b are formed in outer peripheral portions around the Si pillars 5a and 5b by using the same process as in the formation of the spaces 24a and 24b. Subsequently, a NiSi layer 49a in which an acceptor impurity is pushed outward in a protrusion, a $SiO_2$ layer 50a, a NiSi layer 49b in which a donor impurity is pushed outward in a protrusion, a $SiO_2$ layer 50b are formed by using the same process as in the formation of the NiSi layers 25a and 25b and the $SiO_2$ layers 22a and 22b. Subsequently, the donor impurity and an acceptor impurity are thermally diffused from the NiSi layers 49a and 49b into the Si pillars 5a and 5b. As a result, $P^+$ layers 52a and 52b and $N^+$ layers 53a and 53b are formed in the Si pillars 5a and 5b, and a NiSi layer is formed in the surface layers of the side surfaces of the $P^+$ layers 52a and 52b and the $N^+$ layers 53a and 53b. In the $SiO_2$ layers 2a and 2b, thermal diffusion of the donor impurity and the acceptor impurity and the formation of nickel silicide do not substantially occur. Accordingly, the $P^+$ layer 52a and the $N^+$ layer 53a in the Si pillar 5a are isolated from each other by the $SiO_2$ layer 2a. Similarly, the $P^+$ layer 52b and the $N^+$ layer 53b in the Si pillar 5b are isolated from each other by the $SiO_2$ layer 2b. As a result of the formation of the openings, TiN layers 48a and 48b between the $P^+$ layers 33a and 33b and the $P^+$ layers 52a and 52b are isolated from the TiN layers 12a and 12b.

Figure 2M:
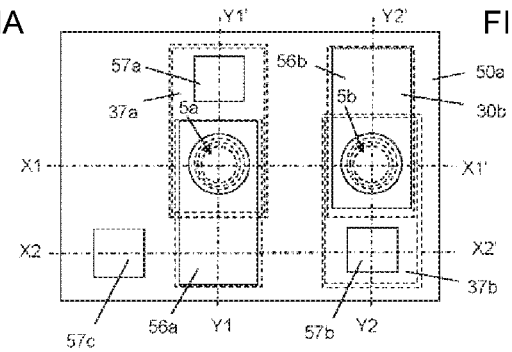
FIG. 2MA and FIGS. 2MB to 2ME are respectively a plan view and sectional structural views that illustrate the method for producing an SGT-including pillar-shaped semiconductor memory device according to the first embodiment.
Figure 2M:
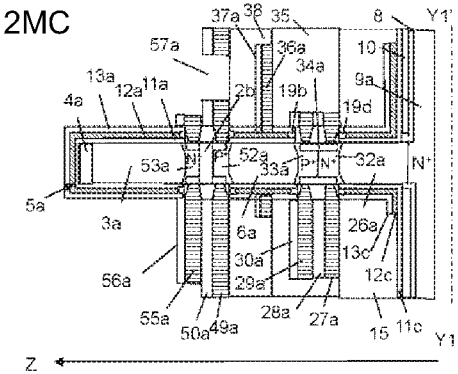
Figure 2M:
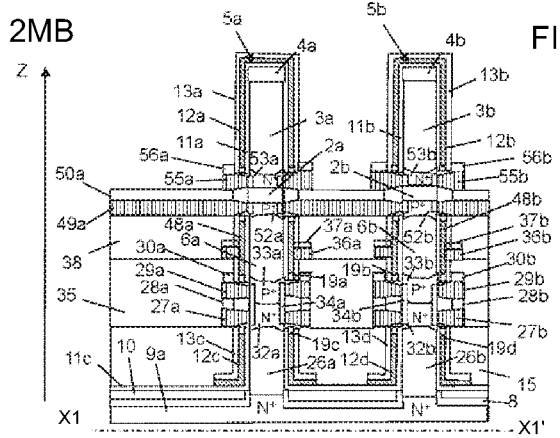
Figure 2M:
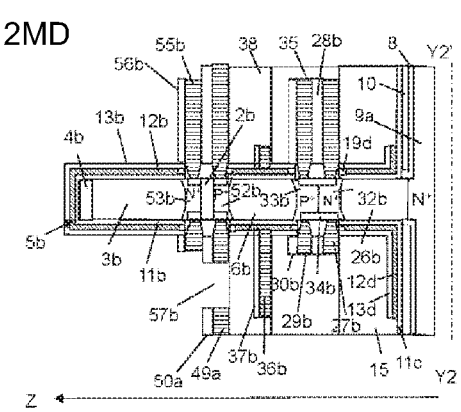
Figure 2M:
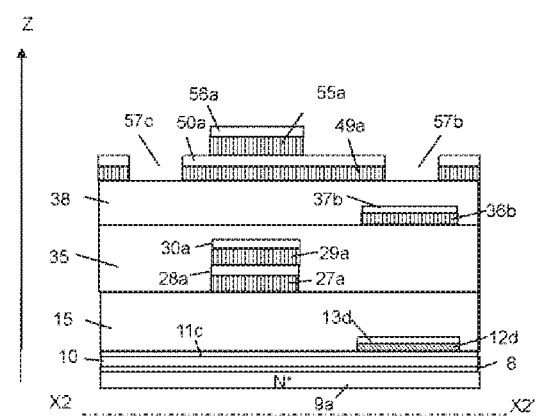

As illustrated in FIGS. 2MA to 2ME, the NiSi layer 49b and the $SiO_2$ layer 50b are patterned by using a lithographic process and an RIE process to form a NiSi layer 55a and a $SiO_2$ layer 56a that surround the Si pillar 5a and overlap the NiSi layers 27a and 29a and the $SiO_2$ layers 28a and 30a in plan view. Similarly, a NiSi layer 55b and a $SiO_2$ layer 56b that surround the Si pillar 5b and overlap the NiSi layers 27b and 29b and the $SiO_2$ layers 28b and 30b in plan view are formed. Subsequently, openings 57a, 57b, and 57c are formed in the NiSi layer 49a and the $SiO_2$ layer 50a by using a lithographic process and an RIE process. The opening 57a is formed on a portion where the TiN layer 12c, the $SiO_2$ layer 13c, the SiN layers 15 and 35, the NiSi layer 36a, the $SiO_2$ layer 37a, and the SiN layer 38 overlap in plan view. The opening 57b is formed on a portion where the TiN layer 12d, the $SiO_2$ layer 13d, the SiN layers 15 and 35, the NiSi layer 36b, the $SiO_2$ layer 37b, and the SiN layer 38 overlap in plan view. The opening 57c is formed on a portion where the $N^+$ layer 9a, the $SiO_2$ layers 8 and 10, the $HfO_2$ layer 11c, the SiN layers 15, 35, and 38 overlap in plan view. Lastly, a SiN layer 59 (not shown) is formed such that the upper surface thereof is positioned higher than the surfaces of the $SiO_2$ layers 56a and 56b and lower than the top of the Si pillars 5a and 5b.

Figure 2N:
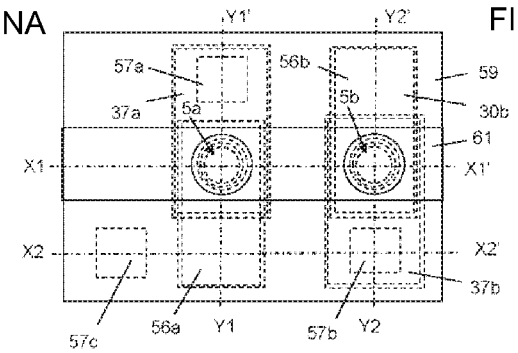
FIG. 2NA and FIGS. 2NB to 2NE are respectively a plan view and sectional structural views that illustrate the method for producing an SGT-including pillar-shaped semiconductor memory device according to the first embodiment.
Figure 2N:
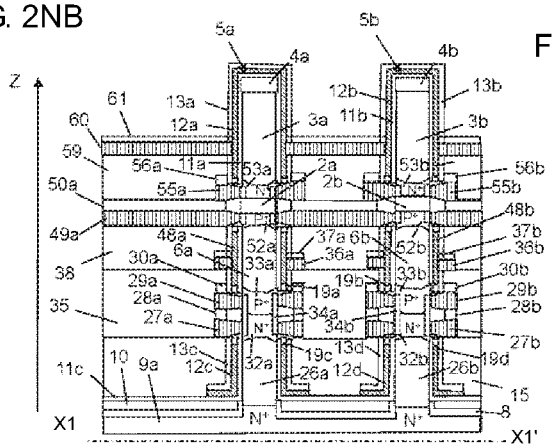
Figure 2N:
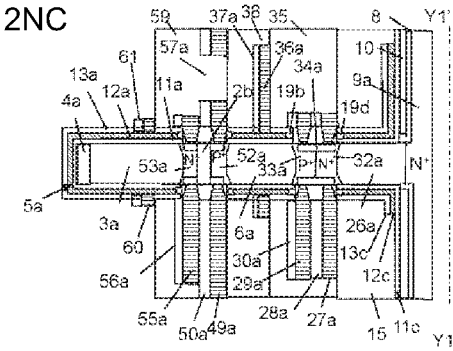
Figure 2N:
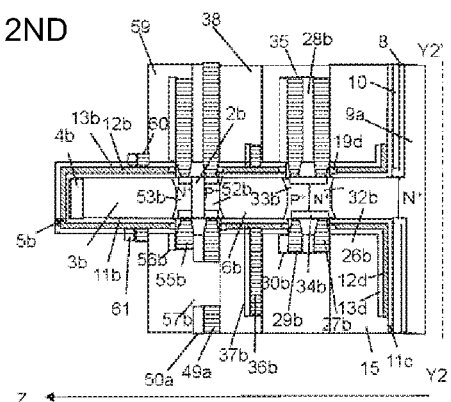
Figure 2N:
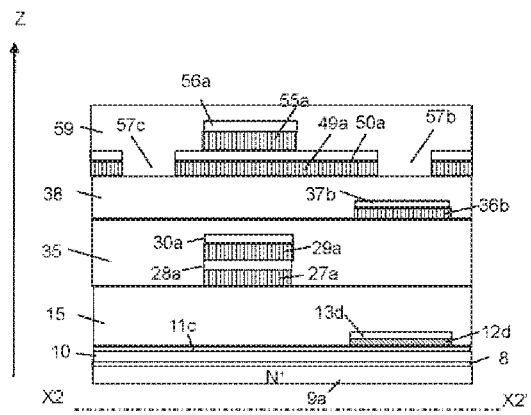

Subsequently, as illustrated in FIGS. 2NA to 2NE, a NiSi layer 60 surrounding the outer peripheries of the Si pillars 5a and 5b and connected to the TiN layers 12a and 12b, and a $SiO_2$ layer 61 surrounding the outer peripheries of the Si pillars 5a and 5b and connected to the $SiO_2$ layers 13a and 13b are formed by using the same process as in the formation of the NiSi layers 36a and 36b and the $SiO_2$ layers 37a and 37b. The NiSi layer 60 and the $SiO_2$ layer 61 extend in the direction of line X1-X1' in plan view.

Figure 2P:
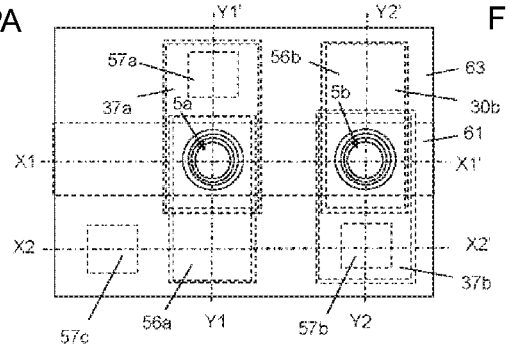
FIG. 2PA and FIGS. 2PB to 2PE are respectively a plan view and sectional structural views that illustrate the method for producing an SGT-including pillar-shaped semiconductor memory device according to the first embodiment.
Figure 2P:
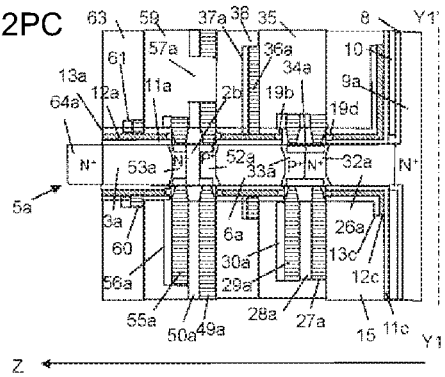
Figure 2P:
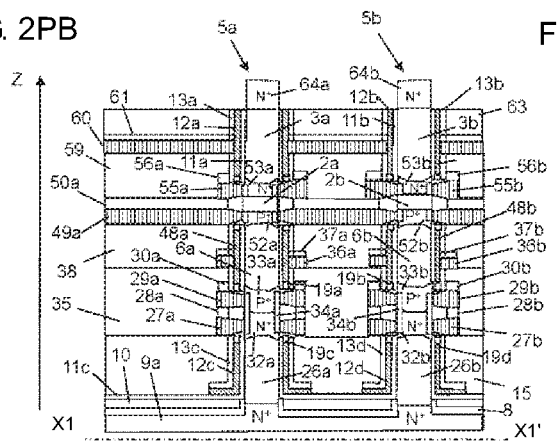
Figure 2P:
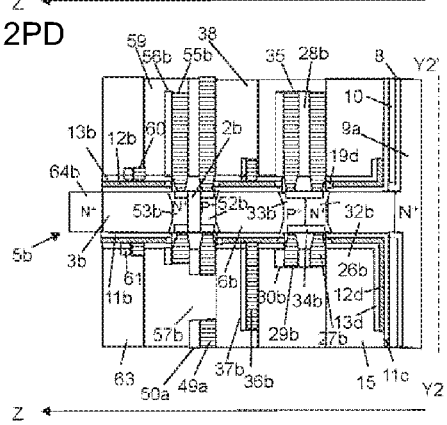
Figure 2P:
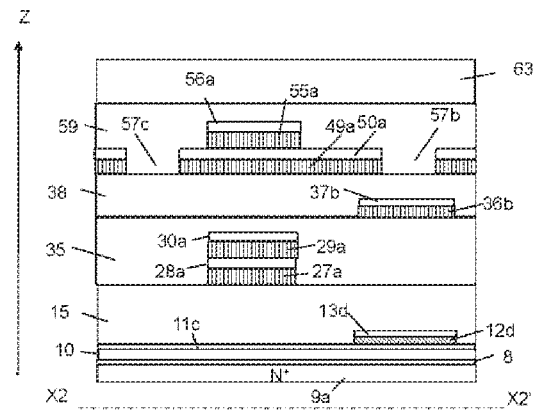

Subsequently, as illustrated in FIGS. 2PA to 2PE, a $SiO_2$ layer 63 is formed such that the upper surface thereof is positioned higher than the surface of the $SiO_2$ layer 61 and lower than the top of the Si pillars 5a and 5b. Subsequently, portions of the $SiO_2$ layers 4a, 4b, 13a, and 13b, the TiN layers 12a and 12b, and the $HfO_2$ layers 11a and 11b, all of which are located on top portions of the Si pillars 5a and 5b, are etched by using the $SiO_2$ layer 63 as a mask. Subsequently, a lithographic process and an ion implantation process are performed by using the $SiO_2$ layers 63, 13a, and 13b, the TiN layers 12a and 12b, and the $HfO_2$ layers 11a and 11b as a mask to implant arsenic (As) ions in top portions of the Si pillars 5a and 5b. As a result, $N^+$ layers 64a and 64b are formed.

Subsequently, as illustrated in FIGS. 2QA to 2QE, a SiO$_2$ layer 65 is formed over the whole structure by a CVD process and an MCP process.

Subsequently, a contact hole 67a is formed on the NiSi layer 29a by using a lithographic process and an RIE process so as to extend through the SiO$_2$ layers 65 and 63, the SiN layer 59, the SiO$_2$ layer 56a, the NiSi layer 55a, the SiO$_2$ layer 50a, the NiSi layer 49a, the SiN layers 38 and 35, and the SiO$_2$ layer 30a. Similarly, a contact hole 67b is formed on the NiSi layer 29b by using a lithographic process and an RIE process so as to extend through the SiO$_2$ layers 65 and 63, the SiN layer 59, the SiO$_2$ layer 56b, the NiSi layer 55b, the SiO$_2$ layer 50b, the NiSi layer 49a, the SiN layers 38 and 35, and the SiO$_2$ layer 30b.

Subsequently, a contact hole 68a is formed on the NiSi layer 55a so as to extend through the SiO$_2$ layers 65 and 63, the SiN layer 59, and the SiO$_2$ layer 56a and to surround the outside of the contact hole 67a in plan view. Similarly, a contact hole 68b is formed on the NiSi layer 55b so as to extend through the SiO$_2$ layers 65 and 63, the SiN layer 59, and the SiO$_2$ layer 56b and to surround the outside of the contact hole 67b in plan view.

Subsequently, the inside of each of the contact holes 67a and 68a is entirely covered with a SiO$_2$ layer (not shown) by an ALD process. Subsequently, portions of the SiO$_2$ layers located on the upper surfaces of the NiSi layers 29a and 55a are removed by an RIE process to leave SiO$_2$ layers 69a and 70a on the side surfaces of the contact holes 67a and 68a, respectively. Similarly, a SiO$_2$ layer 69b is formed on the side surface of the contact holes 67b, and a SiO$_2$ layer 70b is formed on the side surface of the contact holes 68b by using the same process as in the formation of the SiO$_2$ layers 69a and 70a.

Subsequently, a contact hole 71a is formed on the TiN layer 12c by using a lithographic process and an RIE process so as to extend through the SiO$_2$ layers 65 and 63, the SiN layers 59 and 38, the SiO$_2$ layer 37a, the NiSi layer 36a, the SiN layers 35 and 15, and the SiO$_2$ layer 13c and to be located inside the opening 57a in plan view. Similarly, a contact hole 71b is formed on the TiN layer 12d so as to extend through the SiO$_2$ layers 65 and 63, the SiN layers 59 and 38, the SiO$_2$ layer 37b, the NiSi layer 36b, the SiN layers 35 and 15, and the SiO$_2$ layer 13d and to be located inside the opening 57b in plan view.

Subsequently, a wiring metal layer 72 that connects the TiN layer 12c, the NiSi layer 36a, the NiSi layer 29b, and the NiSi layer 55b together through the contact hole 71a and the contact holes 67b and 68b is formed on the SiO$_2$ layer 65. In this structure, since the side surface of the NiSi layer 49a inside the contact hole 67b is covered with the SiO$_2$ layer 69b, the wiring metal layer 72 and the NiSi layer 49a are insulated from each other with the SiO$_2$ layer 69b therebetween. Similarly, a wiring metal layer 73 that connects the TiN layer 12d, the NiSi layer 36b, the NiSi layer 29a, and the NiSi layer 55a together through the contact hole 71b and the contact holes 67a and 68a is formed. In this structure, since the side surface of the NiSi layer 49a inside the contact hole 67a is covered with the SiO$_2$ layer 69a, the wiring metal layer 73 and the NiSi layer 49a are insulated from each other with the SiO$_2$ layer 69a therebetween.

Figure 2R:
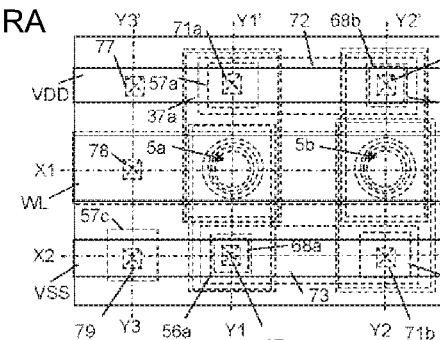
FIG. 2RA and FIGS. 2RB to 2RF are respectively a plan view and sectional structural views that illustrate the method for producing an SGT-including pillar-shaped semiconductor memory device according to the first embodiment.
Figure 2R:
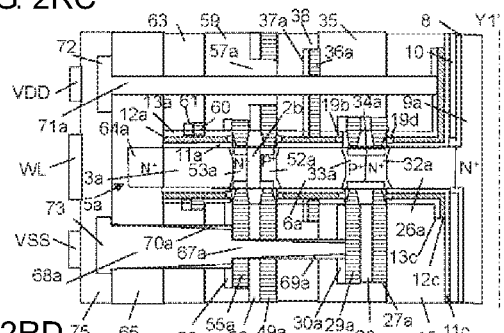
Figure 2R:
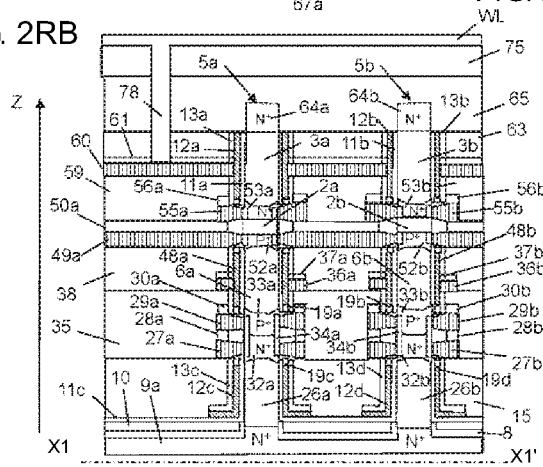
Figure 2R:
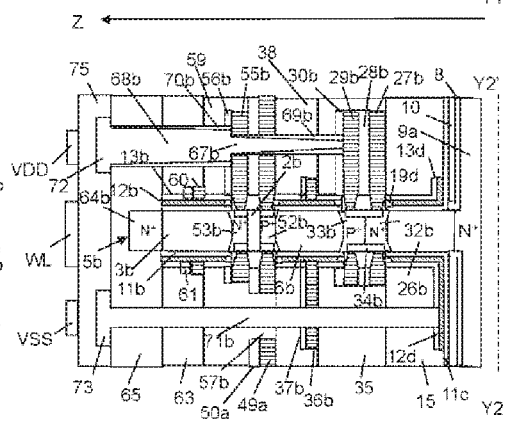
Figure 2R:
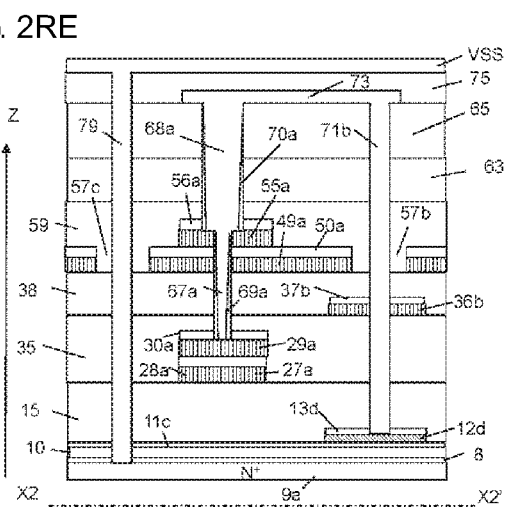
Figure 2R:
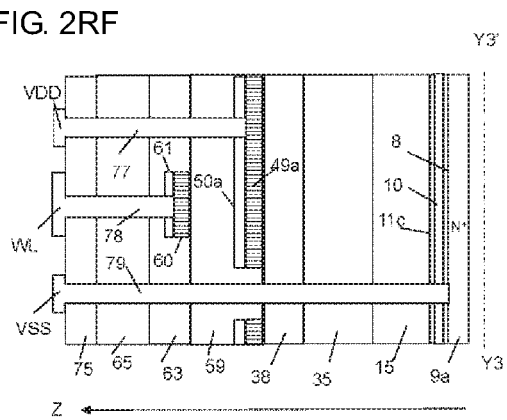

As illustrated in FIGS. 2RA to 2RF, a SiO$_2$ layer 75 is formed over the whole structure. Subsequently, a contact hole 77 is formed on the NiSi layer 49a so as to extend through the SiO$_2$ layers 75, 65, and 63, the SiN layer 59, and the SiO$_2$ layer 50a. A contact hole 78 is formed on the NiSi layer 60 so as to extend through the SiO$_2$ layers 75, 65, 63, and 61. A contact hole 79 is formed on the N$^+$ layer 9a so as to extend through the SiO$_2$ layers 75, 65, and 63, the SiN layers 59, 38, 35, and 15, the HfO$_2$ layer 11c, and the SiO$_2$ layers 10 and 8. Subsequently, a power supply wiring metal layer VDD connected to the NiSi layer 49a via the contact hole 77, a word-line wiring metal layer WL connected to the NiSi layer 60 via the contact hole 78, and a ground wiring metal layer VSS connected to the N$^+$ layer 9a via the contact hole 79 are formed. The power supply wiring metal layer VDD, the word-line wiring metal layer WL, and the ground wiring metal layer VSS extend in the direction of line X1-X1' in plan view.

Figure 2S:
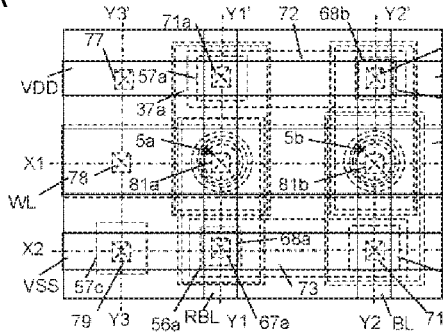
FIG. 2SA and FIGS. 2SB to 2SF are respectively a plan view and sectional structural views that illustrate the method for producing an SGT-including pillar-shaped semiconductor memory device according to the first embodiment.
Figure 2S:
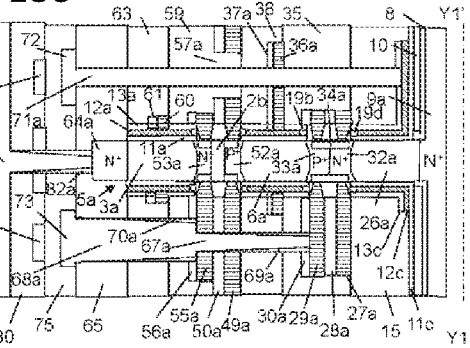
Figure 2S:
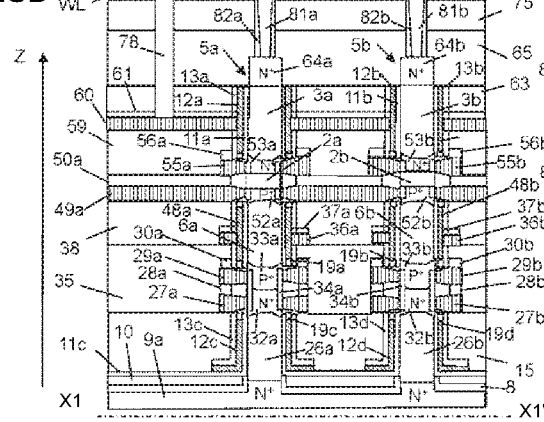
Figure 2S:
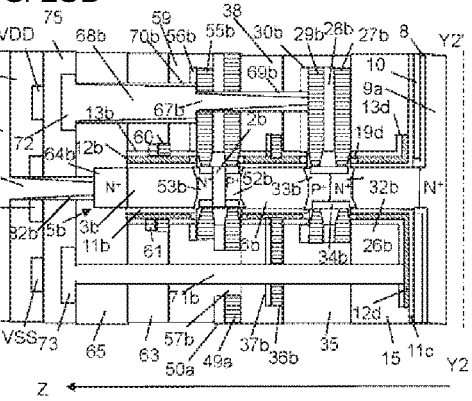
Figure 2S:
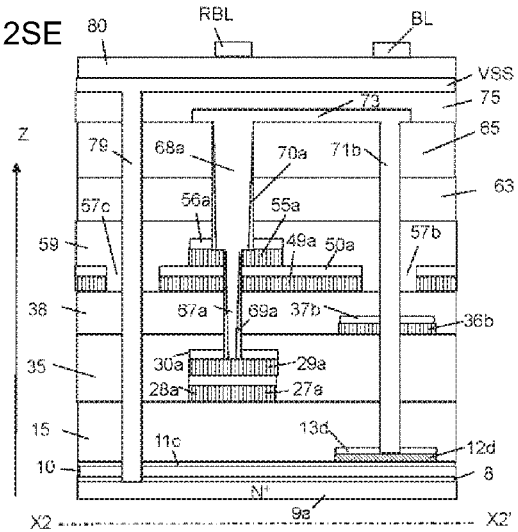
Figure 2S:
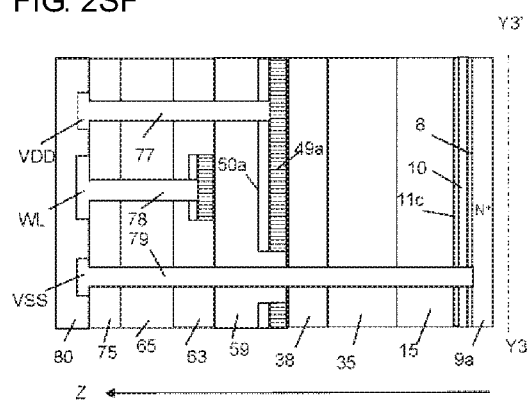

Subsequently, as illustrated in FIGS. 2SA to 2SF, a SiO$_2$ layer 80 is formed on the whole structure. Subsequently, a contact hole 81a is formed on the N$^+$ layer 64a in the top portion of the Si pillar 5a so as to extend through the SiO$_2$ layer 80, the word-line wiring metal layer WL, and the SiO$_2$ layers 75 and 65. Similarly, a contact hole 81b is formed on the N$^+$ layer 64b in the top portion of the Si pillar 5b so as to extend through the SiO$_2$ layer 80, the word-line wiring metal layer WL, and the SiO$_2$ layers 75 and 65. A SiO$_2$ layer (not shown) is formed on the SiO$_2$ layer 80 and inside the contact holes 81a and 81b by an ALD process. Subsequently, portions of the SiO$_2$ layer located on the SiO$_2$ layer 80 and on the N$^+$ layers 64a and 64b are removed by an RIE process. Subsequently, an inverted bit-line wiring metal layer RBL connected to the N$^+$ layer 64a via the contact hole 81a, and a bit-line wiring metal layer BL connected to the N$^+$ layer 64b via the contact hole 81b are formed on the SiO$_2$ layer 80. In this structure, the word-line wiring metal layer WL is insulated from the inverted bit-line wiring metal layer RBL with a SiO$_2$ layer 82a therebetween and is insulated from the bit-line wiring metal layer BL with a SiO$_2$ layer 82b therebetween. As a result, the SRAM cell circuit illustrated in FIG. 1B is formed.

As illustrated in FIGS. 2SA to 2SF, in a lower portion of the Si pillar 5a, an SGT (corresponding to the N-channel SGT DN1 in FIG. 1B) is formed in which the N$^+$ layers 9a and 32a respectively function as a source and a drain, the TiN layer 12c functions as a gate, and the i layer 26a between the N$^+$ layers 9a and 32a functions as a channel; in a middle portion of the Si pillar 5a, an SGT (corresponding to the P-channel SGT LP1 in FIG. 1B) is formed in which the P$^+$ layers 33a and 52a respectively function as a drain and a source, the TiN layer 48a functions as a gate, and the i layer 6a between the P$^+$ layers 33a and 52a functions as a channel; and in an upper portion of the Si pillar 5a, an SGT (corresponding to the N-channel SGT SN1 in FIG. 1B) is formed in which the N$^+$ layers 53a and 64a respectively function as a drain and a source, the TiN layer 12a functions as a gate, and the i layer 3a between the N$^+$ layers 53a and 64a functions as a channel.

Similarly, in a lower portion of the Si pillar 5b, an SGT (corresponding to the N-channel SGT DN2 in FIG. 1B) is formed in which the N$^+$ layers 9a and 32b respectively function as a source and a drain, the TiN layer 12d functions as a gate, and the i layer 26b between the N$^+$ layers 9a and 32b functions as a channel; in a middle portion of the Si pillar 5b, an SGT (corresponding to the P-channel SGT LP2 in FIG. 1B) is formed in which the P$^+$ layers 33b and 52b respectively function as a drain and a source, the TiN layer 48b functions as a gate, and the i layer 6b between the P$^+$ layers 33b and 52b functions as a channel; and in an upper portion of the Si pillar 5b, an SGT (corresponding to the N-channel SGT SN2 in FIG. 1B) is formed in which the N$^+$ layers 53b and 64b respectively function as a drain and a source, the TiN layer 12b functions as a gate, and the i layer 3b between the N+ layers 53b and 64b functions as a channel.

These SGTs (corresponding to the SGTs DN1, LP1, SN1, DN2, LP2, and SN2 in FIG. 1B) are connected together via wires to provide the SRAM cell circuit illustrated as the schematic structural view in FIG. 1B.

The pillar-shaped semiconductor memory device according to the first embodiment and the method for producing the pillar-shaped semiconductor memory device provide the following advantages.

1. As illustrated in FIGS. 2SA to 2SF, an SRAM cell circuit including six SGTs is formed in the two Si pillars 5a and 5b. This enables a further increase in the density of the SRAM cell circuit.

2. As illustrated in FIGS. 2SA to 2SF, the N+ layer 9a connected to the ground wiring metal layer VSS need not include an element isolation region between the Si pillars 5a and 5b. This enables a further increase in the density of the SRAM cell circuit.

3. As illustrated in FIGS. 2SA to 2SF, the NiSi layer 34a connected to the outer peripheries of the N+ layer 32a and the P+ layer 33a, and the NiSi layer 34b connected to the outer peripheries of the N+ layer 32b and the P+ layer 33b are formed. With this structure, the NiSi layer 27a and the NiSi layer 29a are electrically connected to each other, and similarly, the NiSi layer 27b and the NiSi layer 29b are electrically connected to each other. As a result, the wiring metal layer 73 and the NiSi layers 27a and 29a are electrically connected to each other only via the contact holes 67a and 68a that overlap and that are formed on the NiSi layer 29a. Similarly, the wiring metal layer 72 and the NiSi layers 27b and 29b are electrically connected to each other only via the contact holes 67b and 68b that overlap and that are formed on the NiSi layer 29b. This enables an increase in the density of the SRAM cell circuit compared with the case where contact holes are formed on the NiSi layers 27a and 27b to connect the NiSi layers 27a and 27b to the wiring metal layers 73 and 72, respectively.

4. As illustrated in FIGS. 2SA to 2SF, the TiN layer 12c and the NiSi layer 36a that surround the Si pillar 5a and the NiSi layers 27b, 29b, and 55b that surround the Si pillar 5b are formed so as to extend in the upward direction in plan view and connected together. Furthermore, the TiN layer 12d and the NiSi layer 36b that surround the Si pillar 5b and the NiSi layers 27a, 29a, and 55a that surround the Si pillar 5a are formed so as to extend in the downward direction in plan view and connected together. With this structure, in the SRAM cell circuit, an inner wiring connection that does not connect to an adjacent cell can be achieved at a high density.

5. As illustrated in FIGS. 2SA to 2SF, the contact hole 67a is formed on a region of the NiSi layer 29a where the NiSi layers 29a, 49a, and 55a overlap in plan view, the contact hole 68a in which the upper surface of the NiSi layer 55a is exposed is formed so as to surround the contact hole 67a, and the $SiO_2$ layer 69a is formed on the side surface of the contact hole 67a, to thereby connect the NiSi layer 29a to the NiSi layer 55a via the wiring metal layer 73. This enables an increase in the density of the SRAM cell circuit compared with the case where another contact hole is formed on the NiSi layer 29a having a region where the NiSi layer 29a does not overlap the NiSi layer 49a in plan view to connect the NiSi layer 29a to the wiring metal layer 73. Similarly, an increase in the density of the SRAM cell circuit can be realized in the connection of the wiring metal layer 72 and the NiSi layers 29b and 55b via the contact holes 67b and 68b. In addition, an increase in the density of the SRAM cell circuit can be realized in the connection between the N+ layer 64a and the inverted bit-line wiring metal layer RBL via the contact hole 81a, and the connection between the N+ layer 64b and the bit-line wiring metal layer BL via the contact hole 81b, the contact holes 81a and 81b being formed so as to overlap the word-line wiring metal layer WL in plan view.

Second Embodiment

Figure 3A:
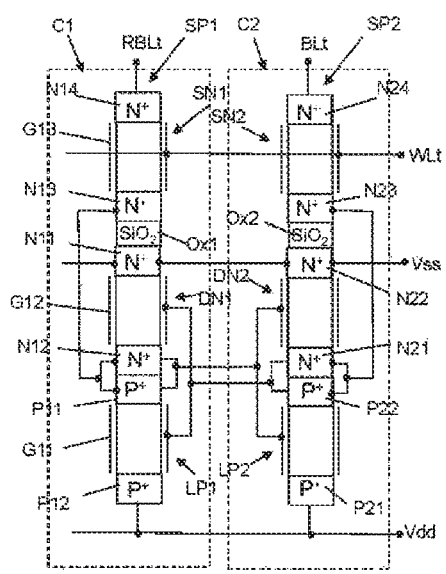
FIG. 3A is a schematic structural view of an SRAM cell circuit, the structural view illustrating an SGT-including pillar-shaped semiconductor memory device according to a second embodiment.
Figure 3B:
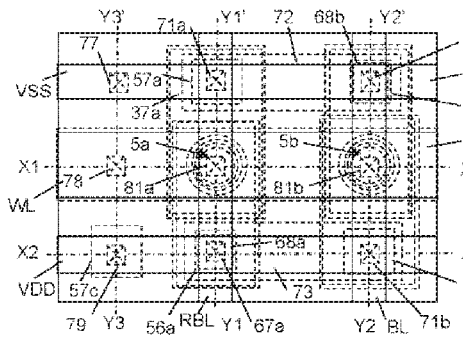
FIG. 3BA and FIGS. 3BB to 3BF are respectively a plan view and sectional structural views that illustrate a method for producing an SGT-including pillar-shaped semiconductor memory device according to the second embodiment.
Figure 3B:
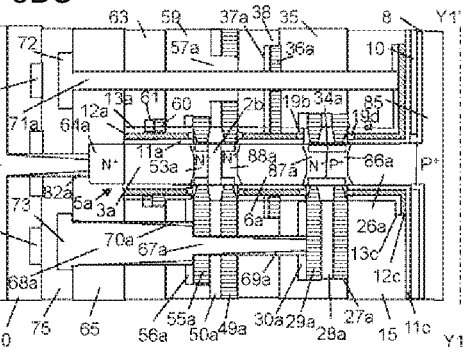
Figure 3B:
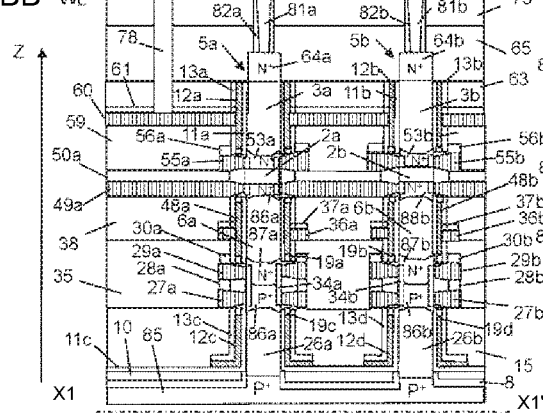
Figure 3B:
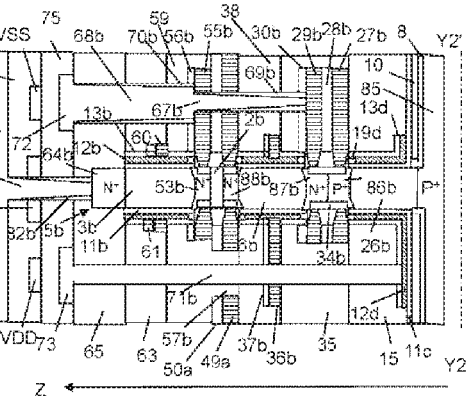
Figure 3B:
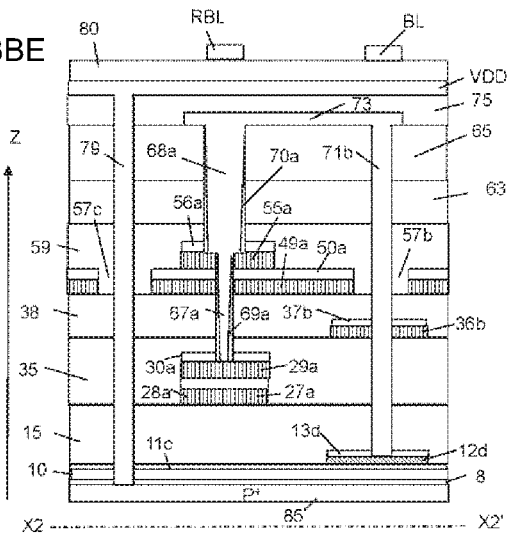
Figure 3B:
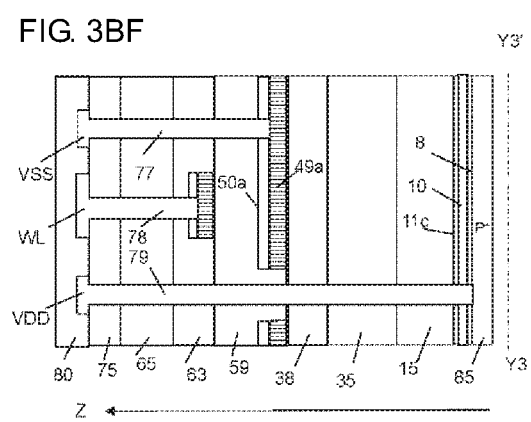

An SGT-including pillar-shaped semiconductor memory device according to a second embodiment of the present invention will now be described with reference to FIG. 3A and FIGS. 3BA to 3BF. FIG. 3A is a schematic structural view of an SRAM cell circuit according to the second embodiment. FIG. 3BA and FIGS. 3BB to 3BF are respectively a plan view and sectional structural views of the SRAM cell circuit according to the second embodiment. FIG. 3BA is a plan view. FIG. 3BB is a sectional structural view taken along line X1-X1' in FIG. 3BA. FIG. 3BC is a sectional structural view taken along line Y1-Y1' in FIG. 3BA. FIG. 3BD is a sectional structural view taken along line Y2-Y2' in FIG. 3BA. FIG. 3BE is a sectional structural view taken along line X2-X2' in FIG. 3BA. FIG. 3BF is a sectional structural view taken along line Y3-Y3' in FIG. 3BA.

As illustrated in FIG. 3A, compared with FIG. 1B of the first embodiment, the positions of an N-channel SGT DN1 functioning as a drive transistor and a P-channel SGT LP1 functioning as a load transistor in a Si pillar SP1 are reversed with respect to the vertical direction. Similarly, the positions of an N-channel SGT DN2 functioning as a drive transistor and a P-channel SGT LP2 functioning as a load transistor in a Si pillar SP2 are opposite with respect to the vertical direction. Accordingly, P+ layers P12 and P21 disposed in bottom portions of the Si pillars SP1 and SP2 are connected to a power supply terminal Vdd, and N+ layers N11 and N22 disposed in upper portions of the Si pillars SP1 and SP2 are connected to a ground terminal Vss. Except for this, the SRAM cell circuit according to the second embodiment is the same as the SRAM cell circuit illustrated in FIG. 1B.

As illustrated in FIGS. 3BA to 3BF, in the vertical direction of a Si pillar 5a, a P+ layer 85 is present in a bottom portion of the Si pillar 5a (in FIGS. 2SA to 2SF, the N+ layer 9a is present), a P+ layer 86a is present at an upper end position of a gate TiN layer 12c (in FIGS. 2SA to 2SF, the N+ layer 32a is present), an N+ layer 87a is present on the P+ layer 86a (in FIGS. 2SA to 2SF, the P+ layer 33a is present), and an N+ layer 88a is present at an upper end position of a gate TiN layer 48a (in FIGS. 2SA to 2SF, the P+ layer 52a is present). Similarly, in the vertical direction of a Si pillar 5b, the P+ layer 85 is present in a bottom portion of the Si pillar 5b (in FIGS. 2SA to 2SF, the N+ layer 9a is present), a P+ layer 86b is present at an upper end position of a gate TiN layer 12d (in FIGS. 2SA to 2SF, the N+ layer 32b is present), an N+ layer 87b is present on the P+ layer 86b (in FIGS. 2SA to 2SF, the P+ layer 33b is present), and an N+ layer 88b is present at an upper end position of a gate TiN layer 48b (in FIGS. 2SA to 2SF, the P+ layer 52b is present). The P+ layer 85 is connected to a power supply wiring metal layer VDD via a contact hole 79 (in FIGS. 2SA to 2SF, connected to the ground wiring metal layer VSS). A NiSi layer 49a is connected to a ground wiring metal layer VSS via a contact hole 77 (in FIGS. 2SA to 2SF, connected to the power supply wiring metal layer VDD).

As illustrated in FIG. 3A, the second embodiment differs from the first embodiment only in that the inverter circuits formed in the Si pillars 5a and 5b are each reversely arranged with respect to the vertical direction. Accordingly, as illustrated in FIGS. 3BA to 3BF, the plan view and the sectional structural views of the SRAM cell circuit of the second embodiment are the same as those of the first embodiment, though the arrangement of the SGTs of the inverter circuits in the Si pillars 5a and 5b are changed. Therefore, an increase in the density of the SRAM cell circuit can be realized as in the first embodiment.

Third Embodiment

Figure 4A:
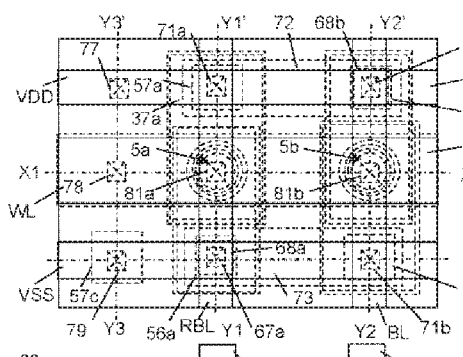
FIG. 4A and FIGS. 4B to 4D are respectively a plan view and sectional structural views that illustrate a method for producing an SGT-including pillar-shaped semiconductor memory device according to a third embodiment.
Figure 4C:
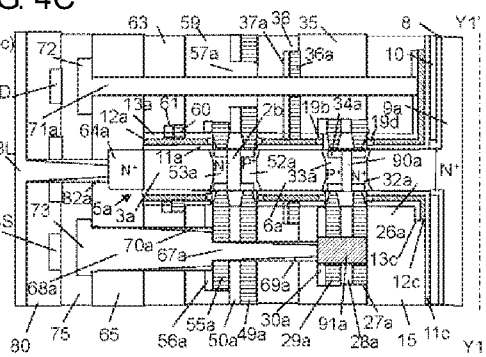
Figure 4B:
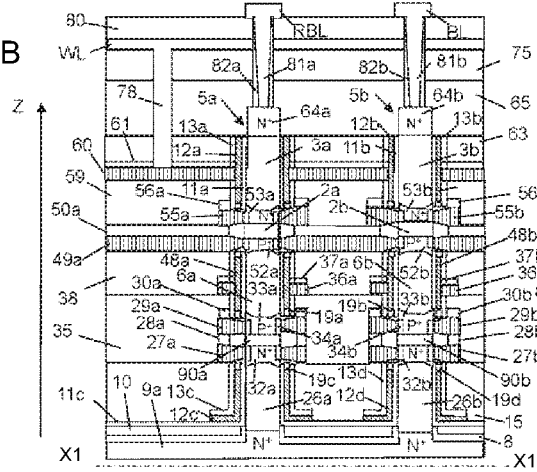
Figure 4D:
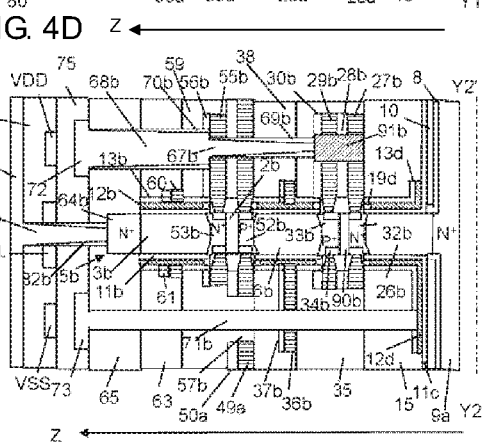
Figure 6:
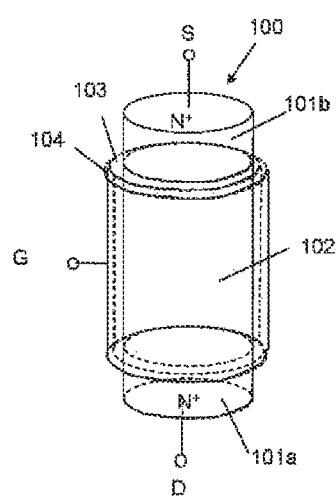
FIG. 6 is a schematic structural view illustrating an existing SGT.

An SGT-including pillar-shaped semiconductor memory device according to a third embodiment of the present invention will now be described with reference to FIGS. 4A to 4D. FIG. 4A is a plan view, FIG. 4B is a sectional structural view taken along line X1-X1' in FIG. 4A, FIG. 4C is a sectional structural view taken along line Y1-Y1' in FIG. 4A, and FIG. 4D is a sectional structural view taken along line Y2-Y2' in FIG. 4A.

As illustrated in FIGS. 4A to 4D, a $SiO_2$ layer 90a is formed between an $N^+$ layer 32a and a $P^+$ layer 33a in a Si pillar 5a, and, for example, a tungsten (W) conductor layer 91a that is in contact with a bottom portion of a contact hole 67a and that extends through NiSi layers 27a and 29a and $SiO_2$ layers 30a and 28a is formed. Similarly, a $SiO_2$ layer 90b is formed between an $N^+$ layer 32b and a $P^+$ layer 33b in a Si pillar 5b, and, for example, a tungsten (W) conductor layer 91b that is in contact with a bottom portion of a contact hole 67b and that extends through NiSi layers 27b and 29b and $SiO_2$ layers 30b and 28b is formed. Other steps are the same as those described in the first embodiment.

As illustrated in FIGS. 4A to 4D, the NiSi layers 27a and 29a are connected to each other through the W conductor layer 91a, and the NiSi layer 27b and 29b are connected to each other through the W conductor layer 91b. As a result, in the Si pillar 5a, even when the $N^+$ layer 32a and the $P^+$ layer 33a are isolated from each other by the $SiO_2$ layer 90a, the NiSi layers 27a and 29a are connected to each other through the W conductor layer 91a. Similarly, in the Si pillar 5b, even when the $N^+$ layer 32b and the $P^+$ layer 33b are isolated from each other by the $SiO_2$ layer 90b, the NiSi layers 27b and 29b are connected to each other through the W conductor layer 91b.

According to the third embodiment, as illustrated in FIGS. 4A to 4D, even when the $SiO_2$ layers 90a and 90b and the W conductor layers 91a and 91b are formed, a decrease in the size of the SRAM cell circuit in plan view does not occur. This enables an increase in the density of the SRAM cell circuit as in the first embodiment.

In addition, the formation of the $SiO_2$ layers 90a and 90b in the Si pillars 5a and 5b in the third embodiment is advantageous in that a high-density logic circuit can be designed because independent three SGTs can be formed in a single Si pillar when, for example, a logic circuit is formed in the periphery of an SRAM cell circuit area.

Fourth Embodiment

An SGT-including pillar-shaped semiconductor memory device according to a fourth embodiment of the present invention will now be described with reference to FIGS. 5A to 5F. FIG. 5A is a plan view, FIG. 5B is a sectional structural view taken along line X1-X1' in FIG. 5A, FIG. 5C is a sectional structural view taken along line Y1-Y1' in FIG. 5A, FIG. 5D is a sectional structural view taken along line Y2-Y2' in FIG. 5A, FIG. 5E is a sectional structural view taken along line X2-X2' in FIG. 5A, and FIG. 5F is a sectional structural view taken along line Y3-Y3' in FIG. 5A.

As illustrated in FIGS. 5A to 5F, compared with FIGS. 2SA to 2SF, the $N^+$ layer 9a that is present in bottom portions of the Si pillars 5a and 5b is replaced by a $P^+$ layer 94, and an SGT in which the $P^+$ layer 94 in the Si pillar 5a functions as the source and an $N^+$ layer 32a functions as the drain and an SGT in which the $P^+$ layer 94 in the Si pillar 5b functions as the source and an $N^+$ layer 32b functions as the drain are tunneling SGTs (regarding the tunneling SGTs, refer to R. Gandhi, Z. Chen, N Singh, K. Banerjee, and S. Lee: "Vertical Si-Nanowire N-type Tunneling FETs With Low Sub-threshold Swing (<50 mV/decade) at Room Temperature", IEEE Electron Device Letter, Vol. 32, No. 4, pp. 437-439 (2011)).

According to the fourth embodiment, since the SGTs functioning as drive transistors are tunneling SGTs, a high-density SRAM cell circuit that is driven at a lower voltage or that is operated at a higher speed is realized.

In the first embodiment, the Si pillars 5a and 5b are formed on the i layer substrate 1 to form the SRAM cell circuit. Alternatively, instead of the i layer substrate 1, a silicon-on-insulator (SOI) substrate including a $SiO_2$ substrate may be used. The SOI substrate may include an insulating material layer other than $SiO_2$. Similarly, this is also applicable to other embodiments according to the present invention.

In the first embodiment, the gate TiN layers 12c and 12d include gate conductor layer portions surrounding the Si pillars 5a and 5b and gate-line wiring conductor layer portions functioning as wiring that horizontally extends to the outer peripheries of bottom portions of the Si pillars 5a and 5b. Alternatively, the gate-line wiring conductor layers connected to the outer peripheral portions of the Si pillars 5a and 5b may be separately formed as gate conductor layer portions and gate-line wiring conductor layer portions as in the NiSi layer 60 connected to the TiN layers 12a and 12b and the NiSi layers 36a and 36b connected to the TiN layers 48a and 48b, respectively. Similarly, this is also applicable to other embodiments according to the present invention.

In the first embodiment, the gate-line wiring conductor layer connected to the outer peripheral portions of the Si pillars 5a and 5b is separately formed as gate conductor layer portions and gate-line wiring conductor layer portions as in the NiSi layer 60 connected to the TiN layers 12a and 12b and the NiSi layers 36a and 36b connected to the TiN layers 48a and 48b, respectively. Alternatively, gate conductor layer portions surrounding the Si pillars 5a and 5b and gate-line wiring conductor layer portions functioning as wiring that horizontally extends to the outer peripheries of bottom portions of the Si pillars 5a and 5b may be formed of the same material layer as in the gate TiN layers 12c and 12d. Similarly, this is also applicable to other embodiments according to the present invention.

In the first embodiment, the TiN layers 12a and 12b functioning as gate conductor layers and the NiSi layer 60 functioning as a gate-line wiring conductor layer that connects the TiN layers 12a and 12b to each other may be integrally formed. Similarly, this is also applicable to other embodiments according to the present invention.

In the first embodiment, a silicide layer or a metal layer such as a tungsten (W) layer may be formed on a surface layer of the bottom $N^+$ layer 9a disposed between the Si pillars 5a and 5b so as to reduce the resistance of the $N^+$ layer 9a disposed between bottom portions of the Si pillars 5a and 5b. Similarly, this is also applicable to other embodiments according to the present invention.

In the first embodiment, silicide is formed in the N-type poly-Si layer 21a and the P-type poly-Si layer 21b due to Ni atoms in the Ni layers 20a and 20b to cause the NiSi layers 25a and 25b to protrude into the spaces 24a and 24b. Instead of the Ni layers 20a and 20b, a layer made of another metal such as titanium (Ti) or cobalt (Co) may be used to cause the protrusion of silicide layers into the spaces 24a and 24b. The same applies to the formation of the NiSi layers 36a, 36b, 49a, 49b, and 60. The NiSi layers 25a, 25b, 36a, 36b, 49a, 49b, and 60 may be formed by other methods. The NiSi layers 25a, 25b, 36a, 36b, 49a, 49b, and 60 may be formed of other conductor material layers. Similarly, this is also applicable to other embodiments according to the present invention.

In the first embodiment, the ground wiring metal layer VSS is formed via the contact hole 79 disposed on the N+ layer 9a. However, for example, in the case where a low-resistance metal layer is provided between the Si pillars 5a and 5b, the contact hole 79 need not be formed. In this case, the low-resistance metal layer provided between the Si pillars 5a and 5b can function as the ground wiring metal layer VSS. The word-line wiring metal layer WL is formed via the contact hole 78 disposed on the NiSi layer 60. However, the formation of the contact hole 78 is not essential. In this case, the NiSi layer 60 can function as the word-line wiring metal layer WL. A low-resistance conductor layer may be used instead of the NiSi layer 60. The power supply wiring metal layer VDD is formed via the contact hole 77 disposed on the NiSi layer 49a. However, the formation of the contact hole 77 is not essential. In this case, the NiSi layer 49a can function as the power supply wiring metal layer VDD. A low-resistance conductor layer may be used instead of the NiSi layer 49a. Similarly, these are also applicable to other embodiments according to the present invention.

In the first embodiment, the NiSi layers 27a, 29a, 27b, and 29b that are insulated by the $SiO_2$ layers 28a and 28b are formed so as to be connected to the N+ layers 32a and 32b and the P+ layers 33a and 33b. In contrast, since the N+ layer 32a and the P+ layer 33a are electrically connected to each other through the NiSi layer 34a, the $SiO_2$ layer 28a is not necessary. Similarly, since the N+ layer 32b and the P+ layer 33b are electrically connected to each other through the NiSi layer 34b, the $SiO_2$ layer 28b is not necessary. The NiSi layers 27a and 29a may be formed at the same time. Similarly, the NiSi layers 27b and 29b may be formed at the same time. Similarly, this is also applicable to other embodiments according to the present invention.

In the first embodiment, the N+ layer 32a and the P+ layer 33a are in contact with each other, and the N+ layer 32b and the P+ layer 33b are in contact with each other. Alternatively, a $SiO_2$ layer may be formed between the N+ layer 32a and the P+ layer 33a and between the N+ layer 32b and the P+ layer 33b. In this case, the contact hole 67a is formed on the NiSi layer 27a through the NiSi layer 29a and the $SiO_2$ layer 28a, to thereby establish contact between the wiring metal layer 73, the N+ layer 32a, and the P+ layer 33a. Similarly, the contact hole 67b is formed on the NiSi layer 27b through the NiSi layer 29b and the $SiO_2$ layer 28b, to thereby establish contact between the wiring metal layer 72, the N+ layer 32b, and the P+ layer 33b. Similarly, this is also applicable to other embodiments according to the present invention.

In the first embodiment, the TiN layers 12c and 12d functioning as the gate conductor layers are formed so as to surround the Si pillars 5a and 5b, respectively, and so that bottom portions thereof extend in the horizontal direction. Alternatively, as in the NiSi layer 60 connected to the gate TiN layers 12a and 12b, the bottom portions extending in the horizontal direction may be formed of conductor layers different from the gate TiN layers 12c and 12d. This is also applicable to other embodiments according to the present invention.

In the first embodiment, the N+ layers 32a, 32b, 53a, 53b and the P+ layers 33a, 33b, 52a, and 52b may be formed by, in the step illustrated in FIGS. 2AA to 2AD, using a substrate that includes an N+ layer and a P+ layer formed by, for example, an epitaxial crystal growth method and a P+ layer and an N+ layer similarly formed by, for example, an epitaxial crystal growth method in an i layer substrate 1 so as to be disposed over and under a $SiO_2$ layer. This is also applicable to other embodiments according to the present invention.

In the first embodiment, the N-type poly-Si layer 21a containing a donor impurity and the P-type poly-Si layer 21b containing an acceptor impurity are respectively formed on the Ni layers 20a and 20b. However, the positional relationship between the Ni layer 20a and the N-type poly-Si layer 21a in the vertical direction, and the positional relationship between the Ni layer 20b and the P-type poly-Si layer 21b in the vertical direction are not limited. The same applies to the formation of the NiSi layers 49a and 49b. A NiSi layer may be formed from a plurality of Ni layers and poly-Si layers. Similarly, this is also applicable to other embodiments according to the present invention.

In the first embodiment, the N-type poly-Si layer 21a containing an arsenic (As) impurity and the P-type poly-Si layer 21b containing a boron (B) impurity are formed. Alternatively, a donor impurity other than an As atom and an acceptor impurity other than a B atom may be introduced in poly-Si layers by an ion implantation process or the like. The same applies to the formation of the NiSi layers 49a and 49b. This is also applicable to other embodiments according to the present invention.

In the first embodiment, the connection between the side surfaces of the Si pillars 5a and 5b and the NiSi layers 25a and 25b, the formation of the NiSi layers 34a and 34b in the Si pillars 5a and 5b, and the formation of the N+ layers 32a and 32b and the P+ layers 33a and 33b are performed by the heat treatments in FIGS. 2IA to 2ID and FIGS. 2JA to 2JD. The connection between the side surfaces of the Si pillars 5a and 5b and the NiSi layers 25a and 25b, the formation of the NiSi layers 34a and 34b in the Si pillars 5a and 5b, and the formation of the N+ layers 32a and 32b and the P+ layers 33a and 33b may be achieved at any timing by the final step in the production of the SRAM cell circuit. The same applies to the formation of the P+ layers 52a and 52b and N+ layers 53a and 53b, all of which have NiSi layers on outer peripheries thereof. This is also applicable to other embodiments according to the present invention.

In the first embodiment, the N-type poly-Si layer 21a and the P-type poly-Si layer 21b are used. Alternatively, amorphous layers may be used. The same applies to the formation of the NiSi layers 49a and 49b. This is also applicable to other embodiments according to the present invention.

In the description of the first embodiment, the SiN layers 15, 35, 38, and 59, which are layers formed of a single SiN material, are used. Alternatively, composite material layers, for example, composite material layers each including a $SiO_2$ layer disposed at a lower position and a SiN layer disposed at an upper position may be used. Alternatively, instead of the SiN layers 15, 35, 38, and 59, insulating material layers having a low diffusion coefficient of HF ions may be used. This is also applicable to other embodiments according to the present invention.

In the first embodiment, the word-line wiring metal layer WL that overlaps the Si pillars 5a and 5b and extends in the direction of line X1-X1' in plan view is formed, the SiO$_2$ layer 80 is then formed, and the N$^+$ layers 64a and 64b in the top portions of the Si pillars 5a and 5b are then respectively connected to the inverted bit-line wiring metal layer RBL and the bit-line wiring metal layer BL via the contact holes 81a and 81b having the SiO$_2$ layers 82a and 82b on inner side surfaces thereof. Alternatively, after the inverted bit-line wiring metal layer RBL and the bit-line wiring metal layer BL are respectively formed on the N$^+$ layers 64a and 64b, the covering with the SiO$_2$ layer, the formation of the contact holes, and the formation of the word-line wiring metal layer WL may be performed. Even in this case, the degree of integration of the SRAM cell circuit does not decrease. This is also applicable to other embodiments according to the present invention.

In the first embodiment, as illustrated in FIGS. 2QA to 2QE, the inside of each of the contact holes 67a and 68a is entirely covered with a SiO$_2$ layer (not shown) by an ALD process, and portions of the SiO$_2$ layers located on the upper surfaces of the NiSi layers 29a and 55a are then removed by an RIE process to leave SiO$_2$ layers 69a and 70a on the side surfaces of the contact holes 67a and 68a, respectively. Alternatively, when the contact holes 67a and 68a are formed by an RIE process, oxygen may be mixed with the etching gas to respectively leave the SiO$_2$ layers 69a and 70a on the side surfaces of the contact holes 67a and 68a. This is also applicable to other embodiments according to the present invention.

In the first embodiment, the gate conductor layers are formed of the TiN layers 12c, 12d, 48a, 48b, 12a, and 12b but are not limited thereto. The gate conductor layers may be formed of another metal material. Alternatively, each of the gate conductor layers may have a multilayer structure including a metal layer and, for example, a poly-Si layer or the like. Similarly, this is also applicable to other embodiments according to the present invention.

In the first embodiment, three SGTs are formed in each of the two Si pillars 5a and 5b. Alternatively, for example, an SGT functioning as a drive transistor may be additionally formed in each of the Si pillars 5a and 5b. The addition of an SGT functioning as a drive transistor enables the speed of the SRAM cell circuit to increase without decreasing the degree of integration. In this manner, three or more SGTs may be formed in each of the Si pillars 5a and 5b. This is also applicable to other embodiments according to the present invention.

The first embodiment describes a case where the NiSi layers 36a, 36b and 60 are connected to the TiN layers 48a, 48b, 12a, and 12b. Alternatively, instead of the NiSi layer, for example, a metal layer such as a TiN layer is used, and the metal layer may be connected to a TiN layer by causing the metal layer to protrude in the horizontal direction due to plastic deformation by a heat treatment. This is also applicable to other embodiments according to the present invention.

In the third embodiment, the W conductor layers 91a and 91b are directly connected to the contact holes 67a and 67b, respectively. Alternatively, the contact holes 67a and 67b may be formed so as to extend through the SiO$_2$ layers 30a and 30b, and the contact holes 67a and 67b may be respectively indirectly connected to the W conductor layers 91a and 91b through the NiSi layers 29a and 29b. Also in this case, since the NiSi layers 27a, 29a, 27b, and 29b have a low resistance, the connection between the wiring metal layer 73 and the NiSi layers 27a and 29a, and the connection between the wiring metal layer 72 and the NiSi layers 27b and 29b can be established at a low resistance.

The fourth embodiment describes a case where the SGTs functioning as drive transistors in the first embodiment are tunneling SGTs. This is also applicable to other embodiments according to the present invention.

The above embodiments describe examples in which Si (silicon) pillars are used as the semiconductor pillars. However, this does not limit the present invention. The technical idea of the present invention is applicable to SGT-including semiconductor devices that include tunneling SGTs and that employ semiconductor pillars formed of a semiconductor material other than silicon.

In each SGT of the embodiments described above, the source, the drain, and the channel are all formed of the same Si. However, the present invention is also applicable to a semiconductor device including an SGT in which some or all of the source, the drain, and the channel are formed of different semiconductor layers.

The SRAM cell circuit in each of the embodiments described above has a circuit configuration in which the circuit areas C1 and C2 each include a CMOS inverter circuit and a selection N-channel SGT. The present invention is applicable to other circuit configurations as long as the circuit areas C1 and C2 having the same circuit configuration form an SRAM cell circuit.

It is to be understood that various embodiments and modifications of the present invention can be made without departing from the broad spirit and the scope of the present invention. The embodiments described above are illustrative examples of the present invention and do not limit the scope of the present invention. The examples and modifications may be combined as required. Furthermore, some of constituent features of the above embodiments may be omitted as required. Such embodiments are also included in the technical scope of the present invention.

The method for producing a pillar-shaped semiconductor memory device according to the present invention provides a semiconductor device having a high degree of integration.

What is claimed is:

1. A method for producing a pillar-shaped semiconductor memory device, the method comprising:
   a step of forming, on a substrate, a first semiconductor pillar and a second semiconductor pillar that extend in a direction perpendicular to a plane of the substrate, and that have inner insulating layers which are formed at a same height and forming semiconductor layers over and under the inner insulating layers, where the insulating layers isolate the semiconductor layers from each other, and that stand adjacent to each other;
   a step of forming a gate insulating layer so as to surround each of the first semiconductor pillar and the second semiconductor pillar;
   a step of forming a gate conductor layer so as to surround the gate insulating layer;
   a step of forming a first impurity region in a bottom portion of the first semiconductor pillar and forming a second impurity region containing an impurity having the same polarity as the first impurity region in a bottom portion of the second semiconductor pillar;
   a step of forming a third impurity region above the first impurity region and within the first semiconductor pillar, and a fourth impurity region at the same height as the third impurity region and within the second semiconductor pillar, the fourth impurity region containing an impurity having the same polarity as the third impurity region;

a step of forming a fifth impurity region above the third impurity region and within the first semiconductor pillar, and a sixth impurity region at the same height as the fifth impurity region and within the second semiconductor pillar, the sixth impurity region containing an impurity having the same polarity as the fifth impurity region;

a step of forming a seventh impurity region located upper than the fifth impurity region of the first semiconductor pillar and below the corresponding inner insulating layer, and an eighth impurity region at the same height as the seventh impurity region and within the second semiconductor pillar, the eighth impurity region containing an impurity having the same polarity as the seventh impurity region;

a step of forming a ninth impurity region located upper than the corresponding inner insulating layer and within the first semiconductor pillar, and a tenth impurity region at the same height as the ninth impurity region and within the second semiconductor pillar, the tenth impurity region containing an impurity having the same polarity as the ninth impurity region;

a step of forming an eleventh impurity region located upper than the ninth impurity region and within the first semiconductor pillar, and a twelfth impurity region at the same height as the eleventh impurity region and within the second semiconductor pillar, the twelfth impurity region containing an impurity having the same polarity as the eleventh impurity region;

a step of forming a first wiring conductor layer surrounding a side surface of the third impurity region, a second wiring conductor layer surrounding a side surface of the fifth impurity region, a third wiring conductor layer surrounding a side surface of the fourth impurity region, and a fourth wiring conductor layer surrounding a side surface of the sixth impurity region;

a step of forming a fifth wiring conductor layer connected to the gate conductor layer located between the fifth impurity region and the seventh impurity region, and a sixth wiring conductor layer connected to the gate conductor layer located between the sixth impurity region and the eighth impurity region at the same height as the fifth wiring conductor layer;

a step of forming a seventh wiring conductor layer surrounding a side surface of the seventh impurity region, an eighth wiring conductor layer surrounding a side surface of the ninth impurity region and insulated from the seventh wiring conductor layer, a ninth wiring conductor layer surrounding a side surface of the eighth impurity region, and a tenth wiring conductor layer surrounding a side surface of the tenth impurity region and insulated from the ninth wiring conductor layer;

a step of forming a twelfth wiring conductor layer connected to the gate conductor layer between the first impurity region and the third impurity region, and the fifth wiring conductor layer overlapping with the twelfth wiring conductor layer in plan view so as to extend in one direction, and forming the third wiring conductor layer, the fourth wiring conductor layer, and the tenth wiring conductor layer so as to overlap each other and extend in the one direction in plan view;

a step of forming a thirteenth wiring conductor layer connected to the gate conductor layer between the second impurity region and the fourth impurity region, and the sixth wiring conductor layer overlapping with the thirteenth wiring conductor layer in plan view so as to extend in a direction opposite to the one direction, and forming the first wiring conductor layer, the second wiring conductor layer, and the eighth wiring conductor layer so as to overlap each other and extend in the direction opposite to the one direction in plan view;

a step of connecting the twelfth wiring conductor layer, the fifth wiring conductor layer, the third wiring conductor layer, the fourth wiring conductor layer, and the tenth wiring conductor layer together; and a step of connecting the thirteenth wiring conductor layer, the sixth wiring conductor layer, the first wiring conductor layer, the second wiring conductor layer, and the eighth wiring conductor layer together.

2. The method for producing a pillar-shaped semiconductor memory device according to claim 1, wherein in the steps of forming the first impurity region to the eighth impurity region, the first impurity region containing a donor impurity atom, the third impurity region containing a donor impurity atom, the fifth impurity region containing an acceptor impurity atom, and the seventh impurity region containing an acceptor impurity atom are formed in the first semiconductor pillar, and the second impurity region containing a donor impurity atom, the fourth impurity region containing a donor impurity atom, the sixth impurity region containing an acceptor impurity atom, and the eighth impurity region containing an acceptor impurity atom are formed in the second semiconductor pillar, and the method further includes a step of connecting the first impurity region and the second impurity region to a first ground wiring conductor layer, a step of connecting the seventh wiring conductor layer and the ninth wiring conductor layer to a first power supply wiring conductor layer, a step of connecting the eleventh wiring conductor layer to a first word-line wiring conductor layer, and a step of connecting one of the eleventh impurity region and the twelfth impurity region to a first bit-line wiring conductor layer and connecting the other to a first inverted bit-line wiring conductor layer.

3. The method for producing a pillar-shaped semiconductor memory device according to claim 1, wherein in the steps of forming the first impurity region to the eighth impurity region, the first impurity region containing an acceptor impurity atom, the third impurity region containing an acceptor impurity atom, the fifth impurity region containing a donor impurity atom, and the seventh impurity region containing a donor impurity atom are formed in the first semiconductor pillar, and the second impurity region containing an acceptor impurity atom, the fourth impurity region containing an acceptor impurity atom, the sixth impurity region containing a donor impurity atom, and the eighth impurity region containing a donor impurity atom are formed in the second semiconductor pillar, and the method further includes a step of connecting the first impurity region and the second impurity region to a second power supply wiring conductor layer, a step of connecting the seventh impurity region and the eighth impurity region to a second ground wiring conductor layer, a step of connecting the eleventh wiring conductor layer to a second word-line wiring conductor layer, and a step of connecting one of the eleventh impurity region and the twelfth impurity region to a second bit-line wiring conductor layer and connecting the other to a second inverted bit-line wiring conductor layer.

4. The method for producing a pillar-shaped semiconductor memory device according to claim 1, the method further comprising:

a step of forming, in a side surface of the first semiconductor pillar, a first silicide region connected to the third impurity region and the fifth impurity region;

a step of forming, in a side surface of the second semiconductor pillar, a second silicide region connected to the fourth impurity region and the sixth impurity region;

a step of forming, on the twelfth wiring conductor layer, a first contact hole extending through the fifth wiring conductor layer;

a step of forming, on the thirteenth wiring conductor layer, a second contact hole extending through the sixth wiring conductor layer;

a step of forming, on the second wiring conductor layer surrounding the first semiconductor pillar, a third contact hole extending through the seventh wiring conductor layer and the eighth wiring conductor layer;

a step of forming, on the fourth wiring conductor layer surrounding the second semiconductor pillar, a fourth contact hole extending through the ninth wiring conductor layer and the tenth wiring conductor layer;

a step of forming a fifth contact hole on the eighth wiring conductor layer so as to surround an outer periphery of the third contact hole in plan view;

a step of forming a sixth contact hole on the tenth wiring conductor layer so as to surround an outer periphery of the fourth contact hole in plan view;

a step of forming a first contact hole side surface insulating layer on inner side surfaces of the third contact hole and the fifth contact hole;

a step of forming a second contact hole side surface insulating layer on inner side surfaces of the fourth contact hole and the sixth contact hole;

a step of forming a first wiring-conductor-layer-connecting conductor layer that connects the twelfth wiring conductor layer, the fifth wiring conductor layer, the third wiring conductor layer, and the fourth wiring conductor layer together via the first contact hole, the fourth contact hole, and the sixth contact hole; and a step of forming a second wiring-conductor-layer-connecting conductor layer that connects the thirteenth wiring conductor layer, the sixth wiring conductor layer, the first wiring conductor layer, and the second wiring conductor layer together via the second contact hole, the third contact hole, and the fifth contact hole.

5. The method for producing a pillar-shaped semiconductor memory device according to claim 1, the method further comprising:

a step of forming a seventh contact hole extending through the first wiring conductor layer and the second wiring conductor layer;

a step of forming an eighth contact hole extending through the third wiring conductor layer and the fourth wiring conductor layer; and a step of filling each of the seventh contact hole and the eighth contact hole with a buried conductor layer.

6. The method for producing a pillar-shaped semiconductor memory device according to claim 1, the method further comprising:

a step of forming the first wiring conductor layer and the second wiring conductor layer that are formed of the same conductor material layer so as to be connected to each other in a vertical direction, and forming the third wiring conductor layer and the fourth wiring conductor layer that are formed of the same conductor material layer so as to be connected to each other in the vertical direction.

* * * * *